US012262617B2

United States Patent
Kim et al.

(10) Patent No.: US 12,262,617 B2
(45) Date of Patent: Mar. 25, 2025

(54) DISPLAY DEVICE

(71) Applicant: Samsung Display Co., Ltd., Yongin-si (KR)

(72) Inventors: Jong-hwa Kim, Seoul (KR); Kyungsu Lee, Suwon-si (KR); Jeongyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/607,114

(22) Filed: Mar. 15, 2024

(65) Prior Publication Data

US 2024/0260382 A1    Aug. 1, 2024

Related U.S. Application Data

(63) Continuation of application No. 17/990,725, filed on Nov. 20, 2022, now Pat. No. 11,957,026, which is a (Continued)

(30) Foreign Application Priority Data

Sep. 10, 2018   (KR) .......................... 10-2018-0107903

(51) Int. Cl.
*G06F 3/044*     (2006.01)
*H10K 50/844*    (2023.01)
(Continued)

(52) U.S. Cl.
CPC ........... *H10K 59/40* (2023.02); *G06F 3/0446* (2019.05); *H10K 50/844* (2023.02);
(Continued)

(58) Field of Classification Search
CPC .... H10K 59/40; H10K 50/844; H10K 50/865; H10K 59/126; H10K 59/131;
(Continued)

(56) References Cited

U.S. PATENT DOCUMENTS 6,946,802 B2 *   9/2005   Hayashi .............. H10K 59/131
                                                         315/159
8,194,223 B2     6/2012   Park
                 (Continued)

FOREIGN PATENT DOCUMENTS

CN    10-7977114 A    5/2018
CN    10-8241456      7/2018
                (Continued)

OTHER PUBLICATIONS

Korean Notice of Allowance issued Oct. 1, 2024, in corresponding KR Patent Application No. 10-2023-0141824.
(Continued)

*Primary Examiner* — Bryan Earles
(74) *Attorney, Agent, or Firm* — Womble Bond Dickinson (US) LLP

(57) ABSTRACT

A display device including a window having a light shielding region and a transmission region, a display panel disposed under the window, and an input detection sensor disposed therebetween and including first electrodes, second electrodes, first signal lines connected to one ends of the first electrodes, second signal lines connected to one ends of the second electrodes, and third signal lines connected to the other ends of the second electrodes. Each of first to $n^{th}$ first signal lines includes bent parts bent multiple times, resistances of the bent parts decrease in a first direction, the first to $n^{th}$ first signal lines are connected to the first electrodes that are arranged farther away from the bent parts in the first direction, and the bent parts of the first to $n^{th}$ first signal lines overlap the light shielding region.

12 Claims, 25 Drawing Sheets

Related U.S. Application Data continuation of application No. 17/237,069, filed on Apr. 22, 2021, now Pat. No. 11,508,790, which is a continuation of application No. 16/537,614, filed on Aug. 11, 2019, now Pat. No. 10,991,771.

(51) Int. Cl.
  *H10K 50/86* (2023.01)
  *H10K 59/126* (2023.01)
  *H10K 59/131* (2023.01)
  *H10K 59/40* (2023.01)

(52) U.S. Cl.
  CPC ......... *H10K 50/865* (2023.02); *H10K 59/126* (2023.02); *H10K 59/131* (2023.02); *H10K 50/86* (2023.02)

(58) Field of Classification Search
  CPC .. H10K 50/86; H10K 59/8792; H10K 59/871; H10K 59/873; H10K 59/50; H10K 59/1213; H10K 59/872; G06F 3/0446; G06F 3/0443; G06F 2203/04112; G06F 3/04164; G06F 3/044; G02F 1/133512; G02F 1/13338; G02F 1/134309; G02F 1/136286

See application file for complete search history.

(56) References Cited

U.S. PATENT DOCUMENTS

| | | | |
|---|---|---|---|
| 8,638,313 | B2 | 1/2014 | Kinoshita et al. |
| 8,717,321 | B2 | 5/2014 | Kim |
| 8,878,081 | B2 | 11/2014 | Kang |
| 9,122,116 | B2 * | 9/2015 | Fujikawa ............... G02F 1/1345 |
| 9,335,881 | B2 | 5/2016 | Jeong |
| 10,133,399 | B2 | 11/2018 | Hashida |
| 10,217,431 | B2 * | 2/2019 | Kim ..................... G09G 3/3696 |
| 10,254,908 | B2 | 4/2019 | Na et al. |
| 10,504,931 | B2 * | 12/2019 | Zhou .................... H01L 21/768 |
| 10,514,800 | B2 | 12/2019 | Jo et al. |
| 10,566,395 | B2 | 2/2020 | Lee |
| 10,579,174 | B2 | 3/2020 | Kim et al. |
| 10,613,694 | B2 | 4/2020 | Tsai et al. |
| 10,698,512 | B2 | 6/2020 | Ishizaki |
| 10,719,156 | B2 | 7/2020 | Li et al. |
| 10,991,771 | B2 | 4/2021 | Kim et al. |
| 11,049,467 | B2 * | 6/2021 | Fujikawa ............ G02F 1/13452 |
| 11,830,883 | B2 * | 11/2023 | Son ..................... G02F 1/13452 |
| 2007/0290603 | A1 * | 12/2007 | Ishizuka ............... H10K 59/179 313/498 |
| 2010/0110041 | A1 | 5/2010 | Jang |
| 2010/0283955 | A1 * | 11/2010 | Kim ..................... G02F 1/1345 349/149 |
| 2010/0328254 | A1 | 12/2010 | Niga et al. |
| 2011/0007005 | A1 | 1/2011 | Lee |
| 2011/0141034 | A1 | 6/2011 | Lai |
| 2012/0227259 | A1 | 9/2012 | Badaye |
| 2013/0135540 | A1 | 5/2013 | Nam |
| 2013/0141664 | A1 | 6/2013 | Toyoyama |
| 2013/0168221 | A1 | 7/2013 | Xie |
| 2013/0249863 | A1 | 9/2013 | Misaki |
| 2013/0271675 | A1 * | 10/2013 | Misaki ................. G02F 1/13338 345/173 |
| 2013/0277186 | A1 | 10/2013 | Sekizawa et al. |
| 2013/0341651 | A1 | 12/2013 | Kim et al. |
| 2014/0062909 | A1 | 3/2014 | Choi |
| 2015/0138041 | A1 | 5/2015 | Hirakata et al. |
| 2015/0185903 | A1 | 7/2015 | Park |
| 2015/0187279 | A1 | 7/2015 | Lee |
| 2016/0334910 | A1 | 11/2016 | Ono et al. |
| 2016/0365062 | A1 * | 12/2016 | Wu ........................ G09G 5/003 |
| 2017/0123574 | A1 | 5/2017 | Inagaki |
| 2017/0131842 | A1 | 5/2017 | Hashiguchi |
| 2017/0177126 | A1 | 6/2017 | Yeh et al. |
| 2017/0307413 | A1 | 10/2017 | Yamai et al. |
| 2018/0031880 | A1 | 2/2018 | Kwak et al. |
| 2018/0157354 | A1 | 6/2018 | Blondin et al. |
| 2018/0182822 | A1 | 6/2018 | Seo et al. |
| 2019/0004653 | A1 | 1/2019 | Won et al. |
| 2019/0129551 | A1 | 5/2019 | Lee et al. |
| 2019/0179466 | A1 | 6/2019 | Kim et al. |
| 2019/0235658 | A1 | 8/2019 | Tsai et al. |
| 2020/0006460 | A1 * | 1/2020 | Chen .................. H10K 59/1315 |

FOREIGN PATENT DOCUMENTS

| | | |
|---|---|---|
| EP | 2985684 | 2/2016 |
| EP | 3276469 | 1/2018 |
| JP | 2009-258935 | 11/2009 |
| JP | 2010-079791 | 4/2010 |
| JP | 2010-231533 | 10/2010 |
| JP | 2011-100438 | 5/2011 |
| JP | 2011-232928 | 11/2011 |
| JP | 2013/214173 A | 10/2013 |
| JP | 2013-225266 | 10/2013 |
| JP | 2015-102942 | 6/2015 |
| JP | 2016197261 A | 11/2016 |
| JP | 2016212762 A | 12/2016 |
| JP | 2017-068300 | 4/2017 |
| JP | 2020-42806 A | 3/2020 |
| KR | 10-2008-0022359 | 3/2008 |
| KR | 10-1287042 | 7/2013 |
| KR | 10-2014-0016071 | 2/2014 |
| KR | 10-2016-0099791 | 8/2016 |
| KR | 10-2016-0103771 | 9/2016 |
| KR | 10-2017-0056798 | 5/2017 |
| KR | 10-2018-0014390 A | 2/2018 |
| KR | 10-2018-0056449 | 5/2018 |
| KR | 10-1868473 | 6/2018 |
| KR | 10-2018-0075784 | 7/2018 |
| KR | 10-2018-0110662 A | 10/2018 |
| WO | WO 2016/113979 A1 | 7/2016 |
| WO | WO 2018/123813 A1 | 7/2018 |
| WO | WO 2018/137589 A1 | 8/2018 |

OTHER PUBLICATIONS

European Search Report dated Dec. 12, 2019, issued in European Patent Application No. 19194015.4.
European Examination Report dated Nov. 5, 2020, issued in European Patent Application No. 19194015.4.
Notice of Allowance dated Jan. 1, 2021, issued in U.S. Appl. No. 16/537,614.
Notice of Allowance dated Nov. 3, 2021, issued in U.S. Appl. No. 17/237,069.
Notice of Allowance dated Mar. 9, 2022, issued in U.S. Appl. No. 17/237,069.
Notice of Allowance dated Jul. 20, 2022, issued in U.S. Appl. No. 17/237,069.

* cited by examiner

DISPLAY DEVICE

CROSS-REFERENCE TO RELATED APPLICATIONS

This application is a continuation application of U.S. patent application Ser. No. 17/990,725, filed Nov. 20, 2022, which is a continuation of U.S. patent application Ser. No. 17/237,069, filed Apr. 22, 2021, issued as U.S. Pat. No. 11,508,790, which is a continuation of U.S. patent application Ser. No. 16/537,614, filed Aug. 11, 2019, issued as U.S. Pat. No. 10,991,771, which claims priority from and the benefit of Korean Patent Application No. 10-2018-0107903, filed on Sep. 10, 2018, which is hereby incorporated by reference for all purposes as if fully set forth herein.

BACKGROUND

Field

Exemplary embodiments of the invention relate generally to a display device, and more specifically, to a display device including an input detection sensor.

Discussion of the Background

Various display devices for use in multimedia devices, such as televisions, mobile phones, tablet computers, navigators, game machines, and the like are being developed. Input devices of display devices include a keyboard, a mouse, and the like. Furthermore, display devices include a touch panel as an input device. The above information disclosed in this Background section is only for understanding of the background of the inventive concepts, and, therefore, it may contain information that does not constitute prior art.

SUMMARY

A display device constructed according to exemplary embodiments of the invention are capable of reducing a visual recognition phenomenon of wiring or signal line.

Additional features of the inventive concepts will be set forth in the description which follows, and in part will be apparent from the description, or may be learned by practice of the inventive concepts.

A display device according to an exemplary embodiment includes a window including a light shielding pattern and a base layer, the base layer including a light shielding region in which the light shielding pattern is disposed and a transmission region adjacent to the light shielding region, a display panel disposed under the window, and an input detection sensor disposed between the window and the display panel, the input detection sensor having a wiring region corresponding to the light shielding region and a sensing region corresponding to the transmission region. The input detection sensor includes a first electrode group includes first to $i^{th}$ electrodes (where "i" is a natural number equal to or greater than 2) arranged in a first direction away from a pad region defined on one side of the light shielding region and extending in a second direction intersecting the first direction, a second electrode group includes first to $j^{th}$ electrodes (where "j" is a natural number equal to or greater than 2) intersecting with the electrodes of the first electrode group, a first signal line group includes first to $i^{th}$ signal lines electrically connected to the first to $i^{th}$ electrodes of the first electrode group, and a second signal line group including first to $j^{th}$ signal lines electrically connected to the first to $j^{th}$ electrodes of the second electrode group. Each of the first to $n^{th}$ signal lines (where "n" is a natural number less than i) of the first signal line group includes a first part extending from the pad region in the first direction, a second part connected to a corresponding electrode of the first electrode group, and a third part disposed between the pad region and the sensing region, having a shape bent multiple times, and connecting the first part to the second part, in which the third part of the first signal line of the first signal line group has a greater length and higher resistance than the third part of the $n^{th}$ signal line of the first signal line group, and at least a portion of the first to $n^{th}$ signal lines of the first signal line group overlap the light shielding pattern in a planar view.

Resistances of the first to $i^{th}$ signal lines of the first signal line group may be substantially the same.

The third part of each of the first to $n^{th}$ signal lines of the first signal line group may overlap the light shielding pattern in a planar view.

The first to $j^{th}$ signal lines of the second signal line group may be respectively connected to one ends of the first to $j^{th}$ electrodes of the second electrode group. The one ends of the first to $j^{th}$ electrodes of the second electrode group are adjacent to the pad region.

The first to $j^{th}$ signal lines of the second signal line group may have a greater length than the first to $i^{th}$ signal lines of the first signal line group.

The $j^{th}$ signal line of the second signal line group may be disposed farthest away from the first electrode of the second electrode group in the first direction, and the $j^{th}$ signal line of the second signal line group may include first to $m^{th}$ extension parts (where "m" is a natural number equal to or greater than 2) arranged in the second direction and intermediate parts disposed between the first to $m^{th}$ extension parts.

The $m^{th}$ extension part may be connected to the $j^{th}$ electrode of the second electrode group.

The first to $m^{th}$ intermediate parts of the $j^{th}$ signal line may become closer to the sensing region in a direction from the first intermediate part of the $j^{th}$ signal line to the $m^{th}$ intermediate part of the $j^{th}$ signal line.

The first intermediate part of the $j^{th}$ signal line of the second signal line group may overlap the light shielding pattern.

The third part of the first signal line of the first signal line group may include a base part extending from the first part in the second direction, first to $k^{th}$ extension parts (where "k" is a natural number equal to or greater than 2) spaced apart from the base part in the first direction, and intermediate parts disposed between the base part and the first extension part, and between the first to $k^{th}$ extension parts (where "k" is a natural number equal to or greater than 2), the first to $k^{th}$ extension parts may become farther away from the base part in a direction from the first extension part to the $k^{th}$ extension part.

The $j^{th}$ signal line of the second signal line group may be connected to the $j^{th}$ electrode of the second electrode group, the $j^{th}$ signal line of the second signal line group may include first to $m^{th}$ extension parts (where "m" is a natural number equal to or greater than 2) arranged in the second direction and intermediate parts disposed between the first to $m^{th}$ extension parts, and the first to $k^{th}$ extension parts may be arranged in one-to-one correspondence with at least a portion of the first to $m^{th}$ extension parts.

The first extension part of the third part of the first signal line of the first signal line group may overlap the light shielding pattern, and the $k^{th}$ extension part of the third part of the first signal line of the first signal line group may not overlap the shielding pattern in a planar view, and the $k^{th}$ extension part may have a greater line width than the first extension part.

The $j^{th}$ signal line of the second signal line group may include a first layer disposed under an insulating layer, and a second layer disposed on the insulating layer and connected to the first layer via contact holes penetrating the insulating layer; and the contact holes may overlap the intermediate parts or end regions of the extension parts adjacent to the intermediate parts in a planar view.

The display panel may include a non-display region corresponding to the light shielding region and a display region corresponding to the transmission region, the display region may include light emission regions and non-light emission regions adjacent to the light emission regions, and each of the first to $i^{th}$ electrodes has a mesh shape including openings corresponding to the light emission regions.

The display panel may include a circuit layer, a display element layer on the circuit layer, and an upper insulating layer on the display element layer, and the input detection sensor may be directly disposed on the upper insulating layer.

Each of the first to $i^{th}$ signal lines of the first signal line group may include a first titanium layer, an aluminum layer on the first titanium layer, and a second titanium layer on the aluminum layer.

Line widths of the third parts of the first to $i^{th}$ signal lines of the first signal line group may be substantially the same.

Each of the display panel and the input detection sensor may include a notch region recessed inwardly in a planar view, the first to $i^{th}$ signal lines of the first signal line group may be respectively connected to one ends of the first to $i^{th}$ electrodes of the first electrode group, the one ends of the first to $i^{th}$ electrodes of the first electrode group may be aligned in a row in the first direction, a length of the first to $p^{th}$ electrodes (where "p" is a natural number greater than 1 and less than i) of the first electrode group in the second direction may be greater than a length of the $(p+1)^{th}$ to $i^{th}$ electrodes of the first electrode group in the second direction, and the other ends of the $(p+1)^{th}$ to $i^{th}$ electrodes of the first electrode group may be adjacent to the notch region.

The first to $j^{th}$ signal lines of the second signal line group may be respectively connected to one ends of the first to $j^{th}$ electrodes of the second electrode group, the one ends of the first to $j^{th}$ electrodes of the second electrode group may be adjacent to the pad region and be aligned in a row in the second direction, a length of the first to $q^{th}$ electrodes (where "q" is a natural number greater than 1 and less than i) of the first electrode group in the first direction may be less than a length of the $(q+1)^{th}$ to $j^{th}$ electrodes of the second electrode group in the first direction, and the other ends of the first to $q^{th}$ electrodes of the first electrode group may be adjacent to the notch region.

Each of the display panel and the input detection sensor may include hole region, the hole region of the display panel and the hole region of the input detection sensor may be aligned in a planar view, and the hole region of the input detection sensor may be defined inside the sensing region.

A display device according to another exemplary embodiment includes a window including a light shielding region and a transmission region adjacent to the light shielding region, a display panel disposed under the window, and an input detection sensor disposed between the window and the display panel, in which the input detection sensor includes first electrodes, second electrodes insulated from and intersecting with the first electrodes, first signal lines connected to one ends of the first electrodes, second signal lines connected to one ends of the second electrodes, and third signal lines connected to the other ends of the second electrodes. Each of first to $n^{th}$ signal lines (where "n" is a natural number equal to or greater than 2) of the first signal lines includes bent parts that are bent multiple times, resistances of the bent parts of the first to $n^{th}$ signal lines decrease in a direction from the first signal line to the $n^{th}$ signal line, the first to $n^{th}$ signal lines are connected to the first electrodes that are arranged farther away from the bent parts in a direction from the first signal line to the $n^{th}$ signal line, and the bent parts of the first to $n^{th}$ signal lines overlap the light shielding region in a planar view.

The one ends of the second electrodes may be arranged closer to the bent parts than the other ends of the second electrodes, the second signal lines include extension parts extending in the same direction as the first electrodes, and a portion of the extension parts of the second signal lines overlap the light shielding region and another portion thereof may be exposed from the light shielding region in a planar view.

A display device according to another exemplary embodiment includes a window, a display panel disposed under the window and an input detection sensor disposed between the window and the display panel. The input detection sensor comprises a first electrode extending in a first direction, a second electrode extending in the first direction, a third electrode intersecting with the first electrode and the second electrode, and insulating from the first electrode and the second electrode, a first signal line electrically connected to an end of the first electrode, a second signal line electrically connected to an end of the second electrode, a third signal line electrically connected to a first end of the third electrode, and a fourth signal line electrically connected to a second end of the third electrode. Each of the first signal line and the second signal line has a shape bent multiple times and comprises a first part extending in the first direction and a second part extending in the first direction, and the first part and the second part of the second signal line is disposed between the first part of the first signal line and the second part of the first signal line in a second direction crossing the first direction.

The first electrode is closer than the second electrode to the first part of the first signal line.

Each of the first signal line and the second signal line has a third part between the first part and the second part and extending in the first direction.

Each of the first signal line and the second signal line comprises a first layer disposed under an insulating layer, and a second layer disposed on the insulating layer and connected to the first layer via contact holes penetrating the insulating layer.

Each of the first signal line and the second signal line comprises a first titanium layer, an aluminum layer on the first titanium layer, and a second titanium layer on the aluminum layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
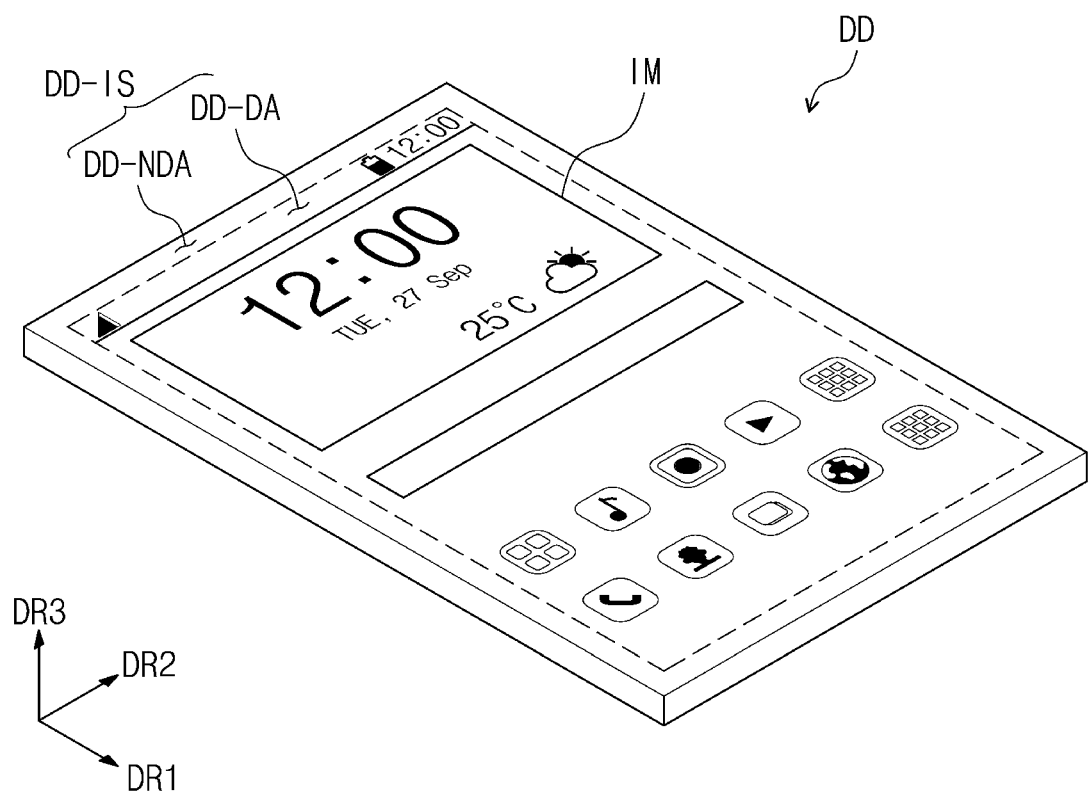
FIG. 1 is a perspective view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device DD according to an exemplary embodiment. Referring to FIG. 1, the display device DD may display an image IM through a display surface DD-IS. The display surface DD-IS is substantially parallel to a surface defining a first direction axis DR1 and a second direction axis DR2. A normal direction of the display surface DD-IS, e.g., a thickness direction of the display device DD, is indicated by a third direction axis DR3.

As used herein, front surfaces (or top surfaces) and rear surfaces (or bottom surfaces) of each member or unit described below may be distinguished by the third direction axis DR3. However, the first to third direction axes DR1 to DR3 may be relative concepts, and may be varied in some exemplary embodiments. Hereinafter, first to third directions which are indicated by the first to third direction axes DR1 to DR3 are referred to by the same reference symbols.

FIG. 1 shows the display device DD as having a flat display surface according to an exemplary embodiment, however, the inventive concepts are not limited thereto. For example, the display device DD may include a curved display surface or a three-dimensional display surface. The three-dimensional display surface may include a plurality of display regions indicating different directions, and may include, for example, a polygonal column-type display surface.

The display device DD according to an exemplary embodiment may be a rigid display device. However, the inventive concepts are not limited thereto, and may be a flexible display device DD, for example. The display device DD may be applicable to a cell phone as illustrated in FIG. 1. In some exemplary embodiments, electronic modules, a camera module, a power supply module, etc., mounted on a main board may be arranged in a bracket/case or the like together with the display device DD to provide a cell phone. However, the inventive concepts are not limited thereto, and the display device DD according to an exemplary embodiment may be applied to a large-size electronic device, such as a television, a monitor, or the like, or a small- or medium-size electronic device, such as a tablet, a vehicle navigator, a game machine, a smart watch, or the like.

The display surface DD-IS includes an image region DD-DA, in which the image IM is displayed, and a bezel region DD-NDA adjacent to the image region DD-DA. An image is not displayed in the bezel region DD-NDA. FIG. 1 illustrates icon images as an example of the image IM.

As illustrated in FIG. 1, the image region DD-DA may have a substantially rectangular shape. The bezel region DD-NDA may surround the image region DD-DA. However, the inventive concepts are not limited thereto, and a shape of the image region DD-DA and a shape of the bezel region DD-NDA may be variously designed.

FIGS. 2A to 2D are cross-sectional views of the display device DD according to an exemplary embodiment. FIGS. 2A to 2D illustrate a cross section defined by the second direction axis DR2 and the third direction axis DR3, and partially show the cross section of the display device DD to clarify a laminate structure of a functional panel and/or functional units included in the display device DD.

The display device DD according to an exemplary embodiment may include a display panel, an input detection sensor, an anti-reflection unit, and a window. At least some elements among the display panel, the input detection sensor, the anti-reflection unit, and the window may be formed through a continuous process or may be coupled to each other using an adhesive member. FIGS. 2A to 2D exemplarily illustrate an optically clear adhesive OCA as the adhesive member. The adhesive member described below may include a typical adhesive or removable adhesive. In an exemplary embodiment, the anti-reflection unit and the window may be replaced with other elements or may be omitted.

With regards to FIGS. 2A to 2D, any one element, formed with another element through a continuous process, among the input detection sensor, the anti-reflection unit, and the window, is referred to as a "layer". Any one element, coupled to another element through an adhesive member, among the input detection sensor, the anti-reflection unit, and the window is referred to as a "panel". The panel includes a base layer that provides a base surface, for example, a synthetic resin film, a composite material film, a glass substrate, or the like, but the "layer" may not be provided with the base layer. In particular, the units referred to as a "layer" are arranged on the base surface provided by another unit.

The input detection sensor, the anti-reflection unit, and the window may be referred to as an input sensing panel ISP, an anti-reflection panel RPP, and a window panel WP, or an input sensing layer ISL, an anti-reflection layer RPL, and a window layer WL.

Figure 2A:
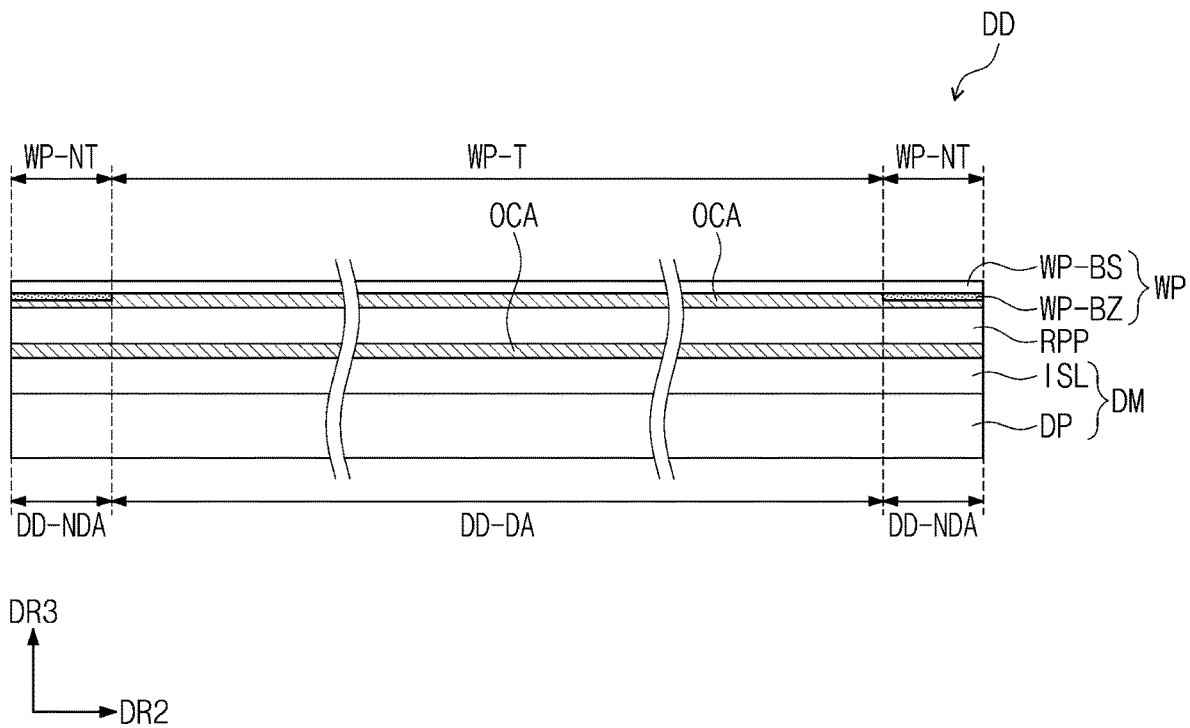
FIGS. 2A, 2B, 2C, and 2D are cross-sectional views of a display device according to an exemplary embodiment.

Referring to FIG. 2A, the display device DD may include a display panel DP, the input sensing layer ISL, the anti-reflection panel RPP, and the window panel WP. The input sensing layer ISL may be directly disposed on the display panel DP. As used herein, an element A being "directly disposed" on another element B may refer to that an additional adhesive layer/adhesive member is not disposed between element A and element B. For example, element B may be formed through a continuous process on the base surface provided by element A, after element A is formed.

The display panel DP and the input sensing layer ISL directly disposed thereon may be defined as a display module DM. Optically clear adhesives OCA are disposed between the display module DM and the anti-reflection panel RPP, and between the anti-reflection panel RPP and the window panel WP.

The display panel DP may generate an image, and the input sensing layer ISL may obtain coordinate information about an external input (e.g., a input event). The display module DM according to an exemplary embodiment may further include a protective member disposed under the display panel DP. The protective member and the display panel DP may be bonded by an adhesive member, for example. The display devices DD described below in FIGS. 2B to 2D may also further include a protective member.

The display panel DP according to an exemplary embodiment may be an emissive display panel, but the inventive concepts are not limited thereto. For example, the display panel DP may be an organic light-emitting display panel or a quantum dot light-emitting display panel. An emission layer of the organic light-emitting display panel may include an organic light-emitting material. An emission layer of the quantum dot light-emitting display panel may include quantum dots, quantum rods, etc. Hereinafter, the display panel DP will be described with reference to an organic light-emitting display panel.

The anti-reflection panel RPP reduces a reflection ratio of external light incident above the window panel WP. The anti-reflection panel RPP according to an exemplary embodiment may include a phase retarder and a polarizer. The phase retarder may be a film type or a liquid crystal coated type, and may include a λ/2 phase retarder and/or a λ/4 phase retarder. The polarizer may be a film type or a liquid crystal coated type. The film type may include a stretched synthetic resin film, and the liquid crystal coated type may include liquid crystals arranged in a predetermined form. The phase retarder and the polarizer may further include a protective film. The phase retarder and polarizer or the protective film thereof may be defined as the base layer of the anti-reflection panel RPP.

The anti-reflection panel RPP according to an exemplary embodiment may include color filters. The color filters may have a predetermined arrangement. The arrangement of the color filters may be determined in consideration of color of light emitted from pixels included in the display panel DP. The anti-reflection panel RPP may further include a black matrix adjacent to the color filters.

The anti-reflection panel RPP according to an exemplary embodiment may include a destructive interference structure. For example, the destructive interference structure may include a first reflective layer and a second reflective layer arranged on different layers. First reflected light and second reflected light reflected from the first reflective layer and the second reflective layer may destructively interfere with each other, thereby reducing the reflection ratio of external light.

The window panel WP according to an exemplary embodiment includes a base layer WP-BS and a light shielding pattern WP-BZ. The base layer WP-BS may include a glass substrate and/or a synthetic resin film. The base layer WP-BS may be a single layer or may include two or more films bonded by an adhesive member.

The light shielding pattern WP-BZ partially overlaps the base layer WP-BS. The light shielding pattern WP-BZ is disposed on a rear surface of the base layer WP-BS in a light shielding region WP-NT of the base layer WP-BS. The light shielding region WP-NT may substantially define the bezel region DD-NDA of the display device DD. A region in which the light shielding pattern WP-BZ is not disposed is defined as a transmission region WP-T of the window panel WP.

Figure 2B:
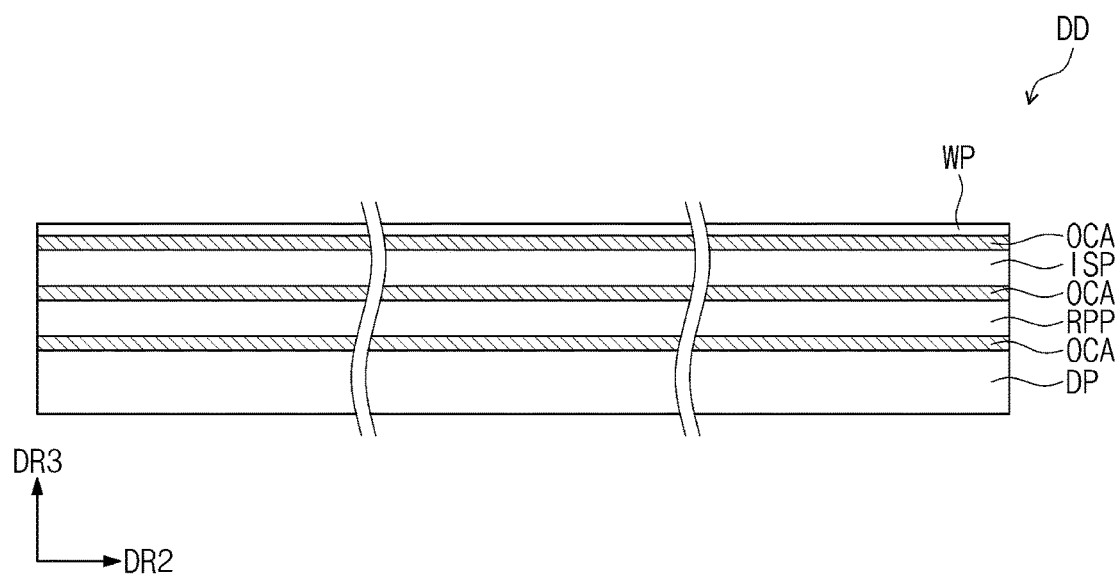
Figure 2C:
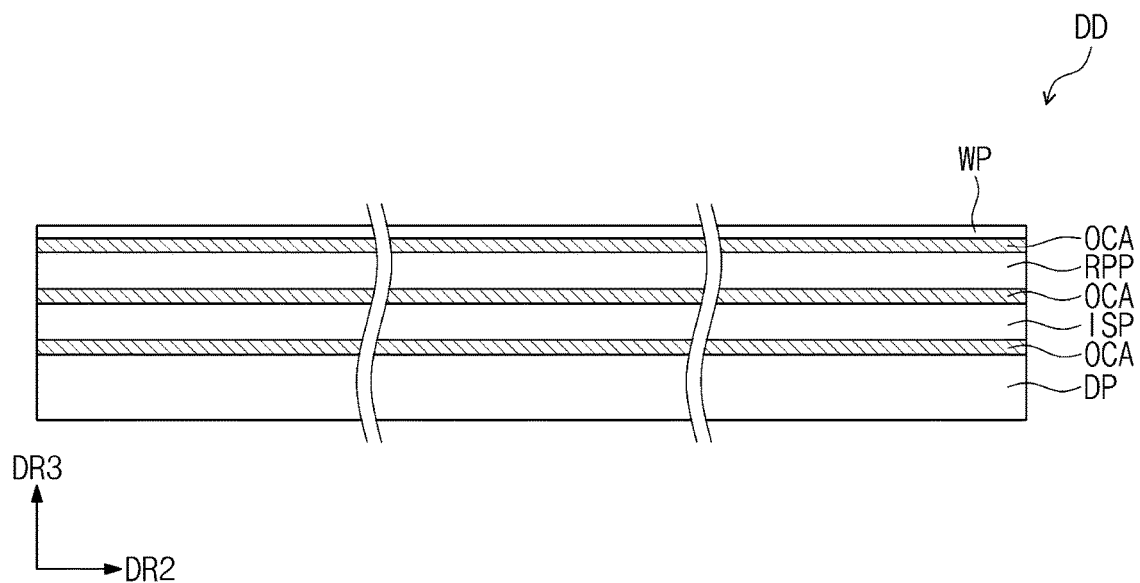
Figure 2D:
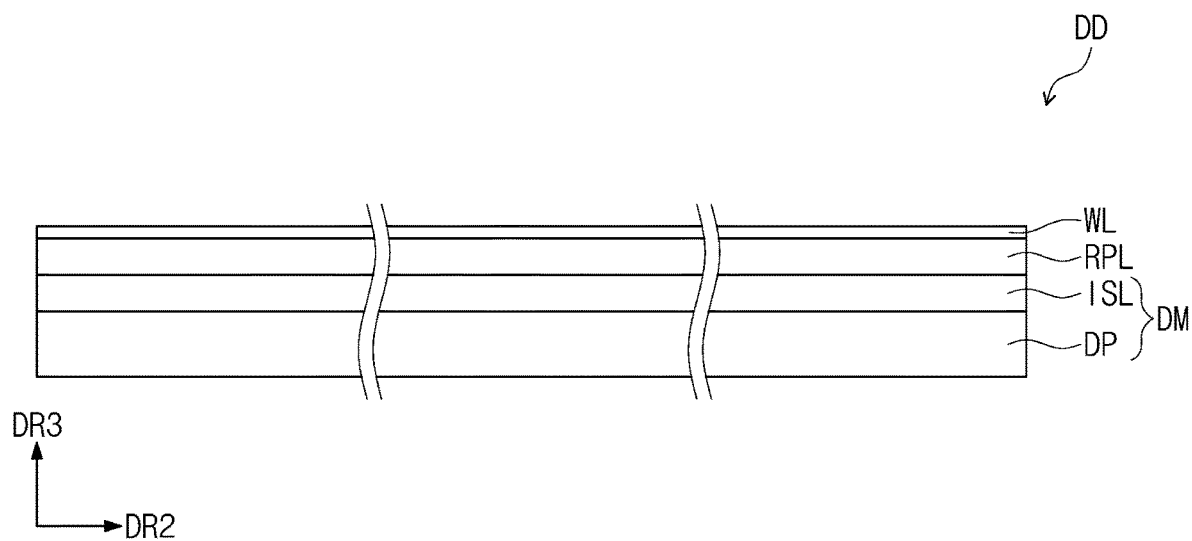

The light shielding pattern WP-BZ may be formed as a colored organic film, for example, by using a coating method. The window panel WP may further include a functional coating layer disposed on a front surface of the base layer WP-BS. The functional coating layer may include an anti-fingerprint layer, an anti-reflection layer, a hard coating layer, etc. In FIGS. 2B to 2D, the window panel WP and the window layer WL are simply illustrated without separately showing the base layer WP-BS and the light shielding pattern WP-BZ.

As illustrated in FIGS. 2B and 2C, the display device DD may include the display panel DP, the anti-reflection panel RPP, the input sensing panel ISP, and the window panel WP. In an exemplary embodiment, the stacked sequence between the input sensing panel ISP and the anti-reflection panel RPP may be changed.

As illustrated in FIG. 2D, the display device DD may include the display panel DP, the input sensing layer ISL, the anti-reflection layer RPL, and the window layer WL. The display device DD may not be provided with adhesive members, and the input sensing layer ISL, the anti-reflection layer RPL, and the window layer WL may be formed through a continuous process on a base surface provided to the display panel DP. In an exemplary embodiment, the stacked sequence between the input sensing layer ISL and the anti-reflection layer RPL may be changed.

Figure 3A:
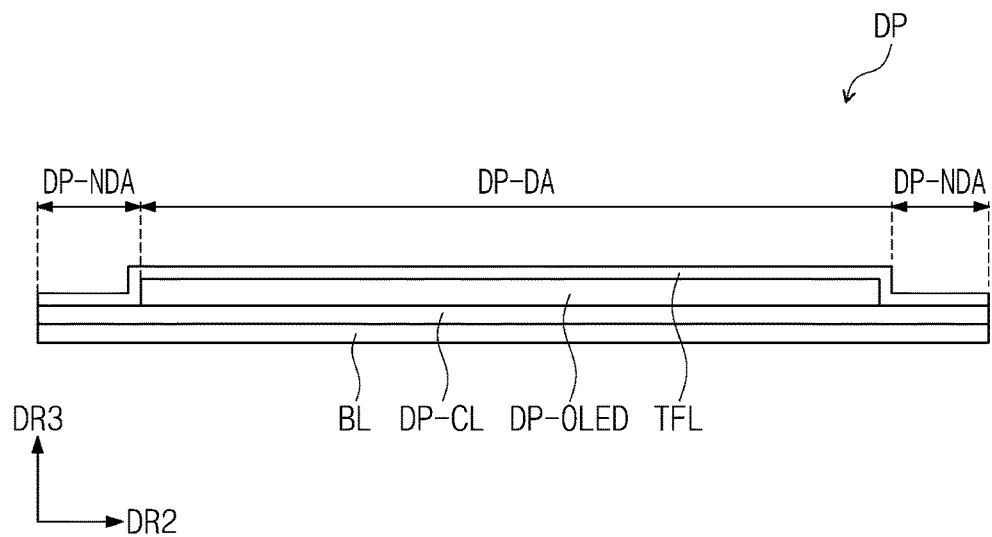
FIGS. 3A and 3B are cross-sectional views of a display panel according to an exemplary embodiment.
Figure 3B:
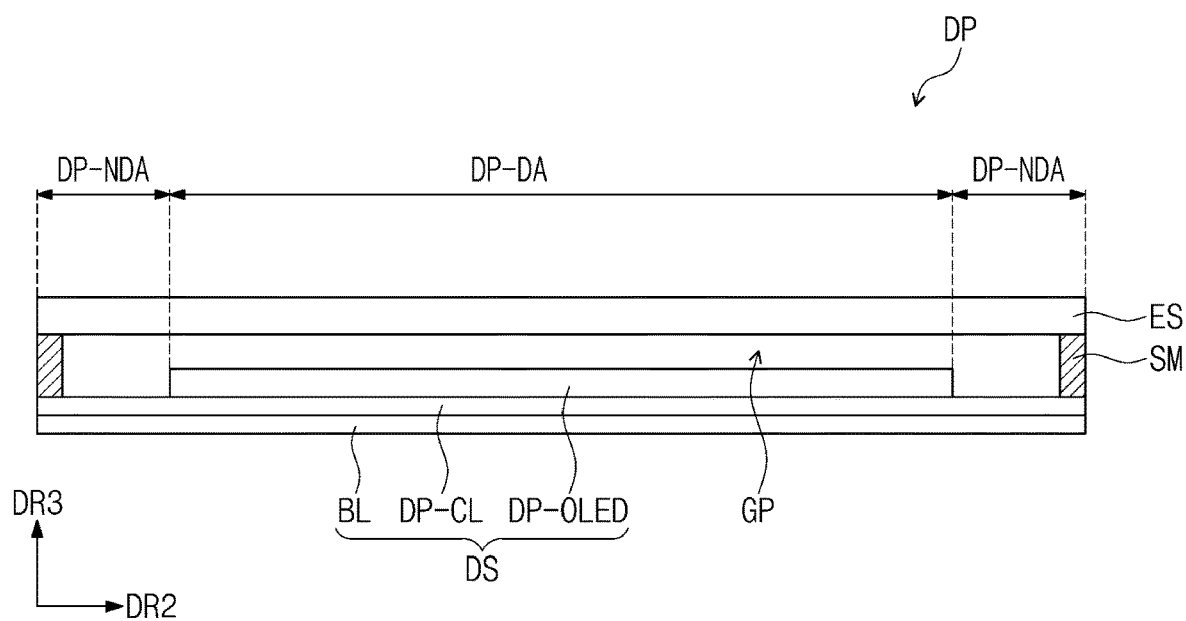

FIGS. 3A and 3B are cross-sectional views illustrating the display panel DP according to an exemplary embodiment.

As illustrated in FIG. 3A, the display panel DP includes a base layer BL, and a circuit element layer DP-CL, a display element layer DP-OLED, and an upper insulating layer TFL disposed on the base layer BL. A display region DP-DA and a non-display region DP-NDA respectively corresponding to the image region DD-DA and the bezel region DD-NDA illustrated in FIG. 1 may be defined in the display panel DP. As used herein, when a region is referred to as corresponding to another region, the regions may overlap each other but may have the same or different areas from each other.

The base layer BL may include at least one plastic film. The base layer BL may include a plastic substrate, a glass substrate, a metal substrate, an organic/inorganic composite material substrate, etc.

The circuit element layer DP-CL may include at least one intermediate insulating layer and a circuit element. The intermediate insulating layer may include at least one intermediate inorganic film and at least one intermediate organic film. The circuit element may include signal lines, a pixel driving circuit, etc, which will be described in more detail below.

The display element layer DP-OLED may include at least one or more organic light-emitting diodes. The display element layer DP-OLED may further include an organic film, such as a pixel defining film.

The upper insulating layer TFL may include a plurality of thin films. A portion of the thin films may be disposed to improve optical efficiency, and another portion of the thin films may be disposed to protect the organic light-emitting diodes. The upper insulating TFL will be described in more detail.

As illustrated in FIG. 3B, the display panel DP includes the base layer BL, the circuit element layer DP-CL, the display element layer DP-OLED, an encapsulation substrate ES arranged on the base layer BL, and a sealant SM for bonding the base layer BL and the encapsulation substrate ES. The encapsulation substrate ES may be spaced apart from the display element layer DP-OLED with a predetermined gap GP therebetween. The base layer BL and the encapsulation substrate ES may include a plastic substrate, a glass substrate, a metal substrate, an organic/inorganic composite material substrate, etc. The sealant SM may include an organic adhesive member, frit, or the like.

Figure 4:
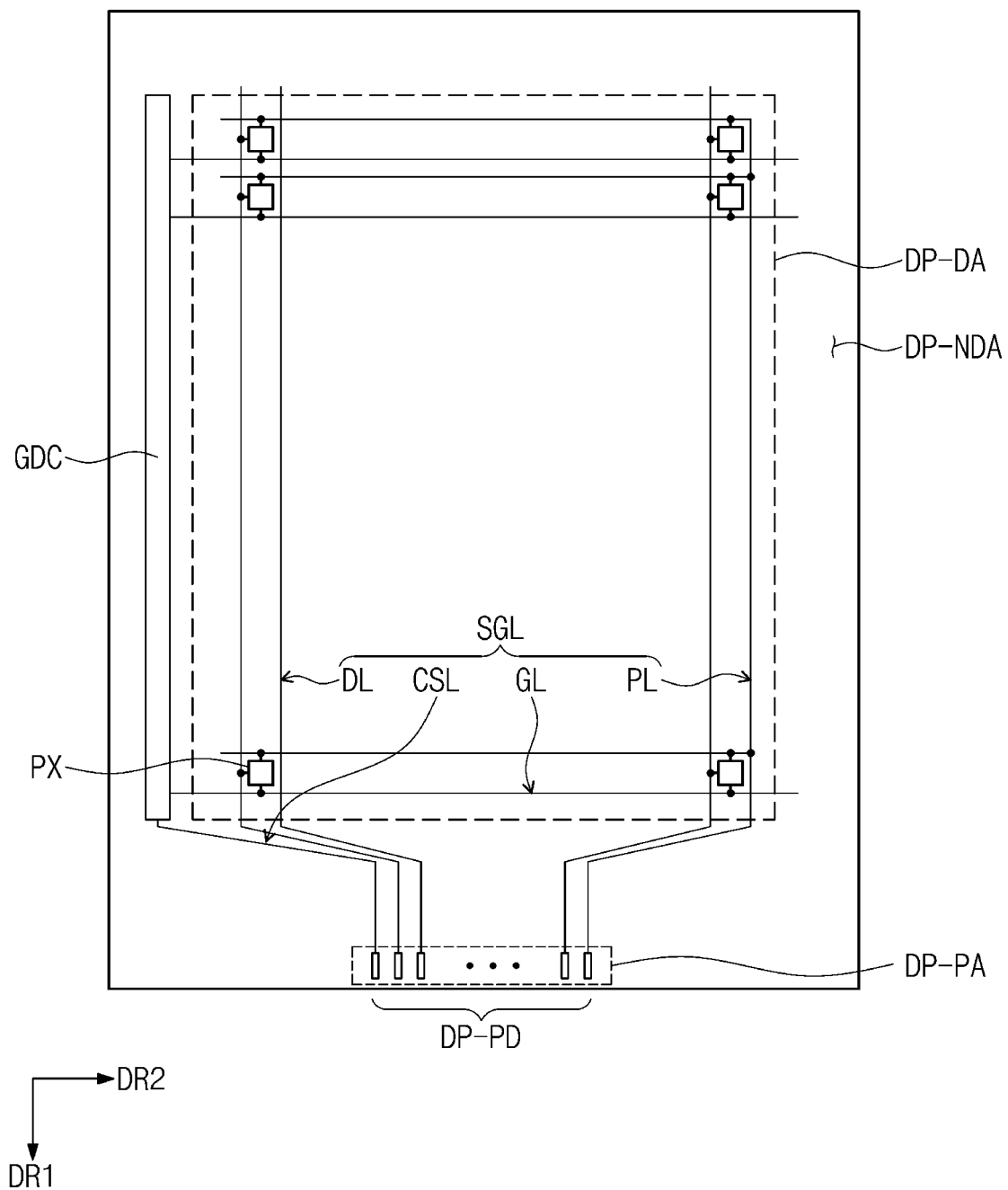
FIG. 4 is a planar view illustrating a display panel according to an exemplary embodiment.
Figure 5A:
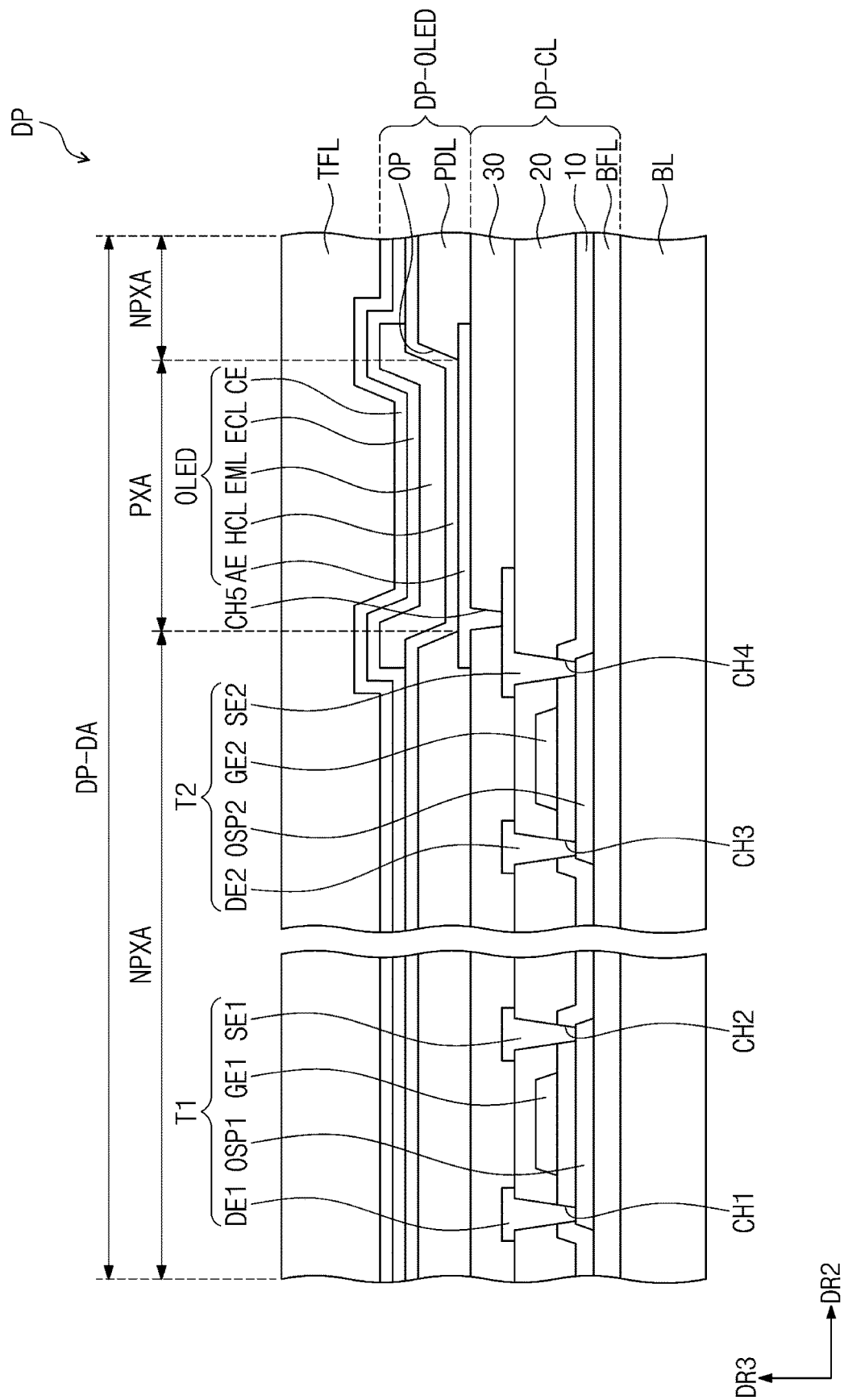
FIG. 5A is an enlarged cross-sectional view of a display panel according to an exemplary embodiment.
Figure 5B:
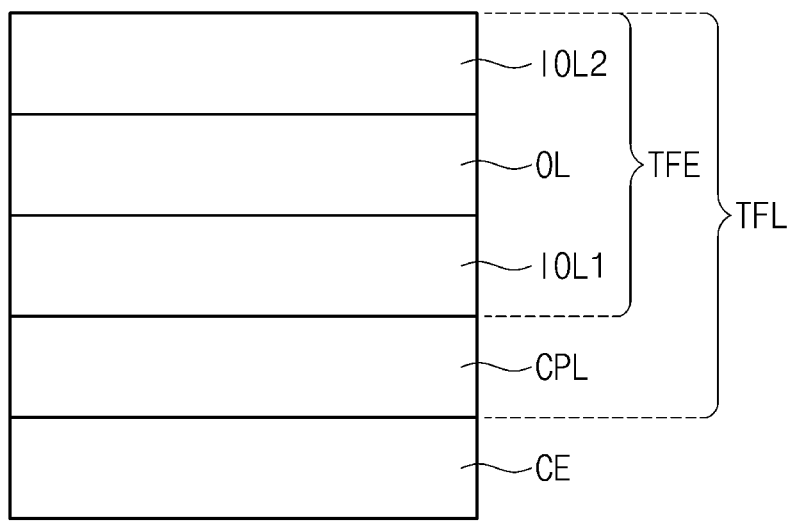
FIG. 5B is an enlarged cross-sectional view of an upper insulating layer according to an exemplary embodiment.

FIG. 4 is a planar view illustrating the display panel DP according to an exemplary embodiment. FIG. 5A is an enlarged cross-sectional view of the display panel DP of FIG. according to an exemplary embodiment. FIG. 5B is an enlarged cross-sectional view of the upper insulating layer TFL according to an exemplary embodiment. FIG. 5A illustrates the display panel DP with reference to the display panel DP of FIG. 3A.

As illustrated in FIG. 4, the display panel DP may include a driving circuit GDC, a plurality of signal lines SGL (hereinafter referred to as "signal lines"), a plurality of signal pads DP-PD (hereinafter referred to as "signal pads"), and a plurality of pixels PX (hereinafter referred to as "pixels").

The display region DP-DA may be defined as a region in which the pixels PX are arranged. Each of the pixels PX includes an organic light-emitting diode and a pixel driving circuit connected thereto. The driving circuit GDC, the signal lines SGL, the signal pads DP-PD, and the pixel driving circuit may be included in the circuit element layer DP-CL illustrated in FIGS. 3A and 3B.

The driving circuit GDC may include a scan driving circuit. The scan driving circuit may generate a plurality of scan signals (hereinafter referred to as "scan signals"), and sequentially output the scan signals to a plurality of scan lines GL (hereinafter referred to as "scan lines") that will be described later. The scan driving circuit may further output another control signal to the driving circuit of the pixels PX.

The scan driving circuit may include a plurality of thin-film transistors formed through the same process as for the driving circuit of the pixels PX, for example, a low temperature polycrystalline silicon (LTPS) process or a low temperature polycrystalline oxide (LTPO) process.

The signal lines SGL include scan lines GL, data lines DL, power supply line PL, and control signal line CSL. The scan lines GL are respectively connected to corresponding pixels PX, and the data lines DL are respectively connected to corresponding pixels PX. The power supply line PL is connected to the pixels PX. The control signal lines CSL may provide control signals to the scan driving circuit.

The signal lines SGL overlap the display region DP-DA and the non-display region DP-NDA. The signal lines SGL may include a pad unit and a line unit. The line unit overlaps the display region DP-DA and the non-display region DP-NDA. The pad unit is connected to an end of the line unit. The pad unit is disposed in the non-display region DP-NDA, and overlaps a corresponding signal pad among the signal pads DP-PD. A part, in which the signal pads DP-PD are arranged, of the non-display region DP-NDA may be defined as a pad region DP-PA. A circuit board may be connected to the pad region DP-PA.

The lint unit substantially connected to the pixel PX may constitute a greater portion of the signal lines SGL. The line unit is connected to transistors T1 and T2 (see FIG. 5A) of the pixel PX. The line unit may have a single-layer/multi-layer structure, and may have a single body or at least two parts. The at least two parts may be arranged on different layers, and may be connected to each other via a contact hole penetrating an insulating layer disposed between the at least two parts.

FIG. 5A partially illustrates a cross-sectional view of the display panel DP corresponding to the transistors T1 and T2 and the light-emitting diode OLED. The circuit element layer DP-CL disposed on the base layer BL may include at least one insulating layer and a circuit element. The circuit element may include a signal line, a pixel driving circuit, etc. The circuit element layer DP-CL may be formed through a process of forming an insulating layer, a semiconductor layer, and a conductive layer, by coating, deposition, or the like, and a process of patterning the insulating layer, the semiconductor layer, and the conductive layer by photolithography.

The circuit element layer DP-CL according to the illustrated exemplary embodiment may include a buffer layer BFL, a first intermediate inorganic film 10, and a second intermediate inorganic film 20, which are inorganic films, and an intermediate organic film 30. The buffer film BFL may include a plurality of laminated inorganic films. FIG. 5A exemplarily illustrates an arrangement of a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which may form a switching transistor T1 and a driving transistor T2. First to fourth through-holes CH1 to CH4 are also exemplarily illustrated.

The display element layer DP-OLED may include an organic light-emitting diode OLED. The display element layer DP-OLED includes a pixel defining film PDL. For example, the pixel defining film PDL may be an organic layer.

A first electrode AE is disposed on the intermediate organic film 30. The first electrode AE is connected to the second output electrode SE2 via a fifth through-hole CH5 penetrating the intermediate organic film 30. An opening OP is defined in the pixel defining film PDL. The opening OP of the pixel defining film PDL exposes at least a part of the first electrode AE. Hereinafter, the opening OP of the pixel defining film PDL may be referred to as a "light emission opening" in order to differentiate the opening OP from other openings.

As illustrated in FIG. 5A, the display region DP-DA may include a light emission region PXA and a non-light emission region NPXA adjacent thereto. The non-light emission region NPXA may surround the light emission region PXA.

The light emission region PXA may correspond to a partial region of the first electrode AE exposed by the light emission opening OP.

A hole control layer HCL may be disposed commonly in the light emission region PXA and the non-light emission region NPXA. The hole control layer HCL may include a hole transport layer, and may further include a hole injection layer. An emission layer EML is disposed on the hole control layer HCL. The emission layer EML may be disposed in a region corresponding to the light emission opening OP. More particularly, the emission layer EML may be separately formed in each pixel. The emission layer EML may include an organic material and/or an inorganic material. The emission layer EML may generate predetermined color light.

An electron control layer ECL is disposed on the emission layer EML. The electron control layer ECL may include an electron transport layer, and may further include an electron injection layer. The hole control layer HCL and the electron control layer ECL may be formed commonly in a plurality of pixels using an open mask. A second electrode CE is disposed on the electron control layer ECL. The second electrode CE may have a single body and may be disposed commonly in a plurality of pixels.

As illustrated in FIGS. 5A and 5B, the upper insulating layer TFL is disposed on the second electrode CE. The upper insulating layer TFL may include a plurality of thin films. The upper insulating layer TFL according to an exemplary embodiment may include a capping layer CPL and a thin-film encapsulation layer TFE. The thin-film encapsulation layer TFE may include a first inorganic layer IOL1, an organic layer OL, and a second inorganic layer IOL2.

The capping layer CPL is disposed on the second electrode CE and contacts the second electrode CE. The capping layer CPL may include an organic material. The first inorganic layer IOL1 is disposed on the capping layer CPL and contacts the capping layer CPL. The organic layer OL is disposed on the first inorganic layer IOL1 and contacts the first inorganic layer IOL1. The second inorganic layer IOL2 is disposed on the organic layer OL and contacts the organic layer OL.

The capping layer CPL protects the second electrode CE from a following process, for example, a sputtering process, and improves light emission efficiency of the organic light-emitting diode OLED. The capping layer CPL may have a greater refractive index than that of the first inorganic layer IOL1.

The first inorganic layer IOL1 and the second inorganic layer IOL2 protect the display element layer DP-OLED from moisture/oxygen, and the organic layer OL protects the display element layer DP-OLED from foreign matter, such as particles of dust. The first inorganic layer IOL1 and the second inorganic layer IOL2 may be any one of a silicon nitride layer, a silicon oxynitride layer, and a silicon oxide layer. In an exemplary embodiment, the first inorganic layer IOL1 and the second inorganic layer IOL2 may further include a titanium oxide layer, an aluminum oxide layer, or the like. The organic layer OL may include an acrylic organic layer, without being limited thereto.

An inorganic layer, for example, a LiF layer, may be further disposed between the capping layer CPL and the first inorganic layer IOL1 in an exemplary embodiment. The LiF layer may improve the light emission efficiency of the light-emitting element OLED.

Figure 6A:
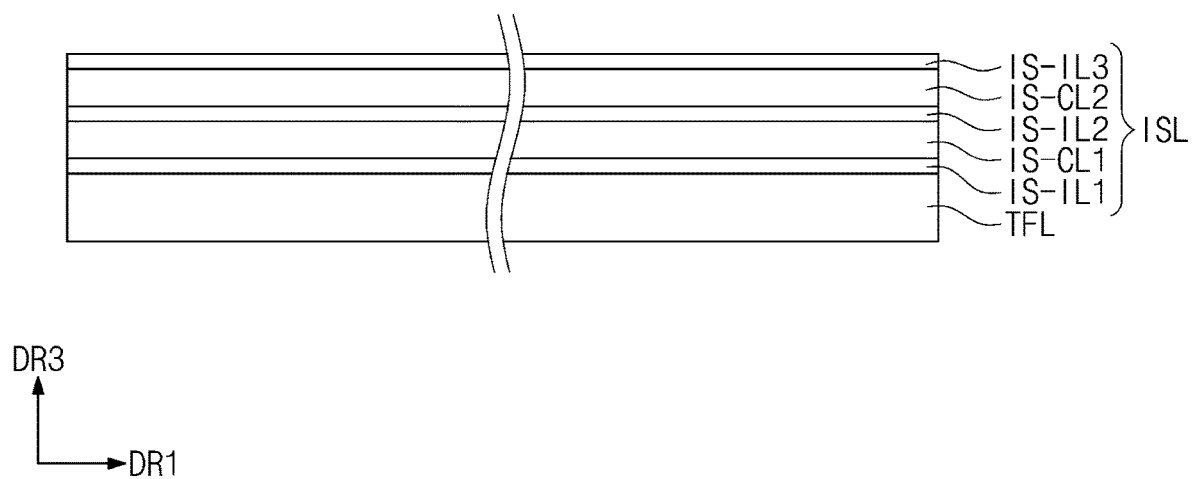
FIG. 6A is a cross-sectional view of an input detection sensor according to an exemplary embodiment.
Figure 6B:
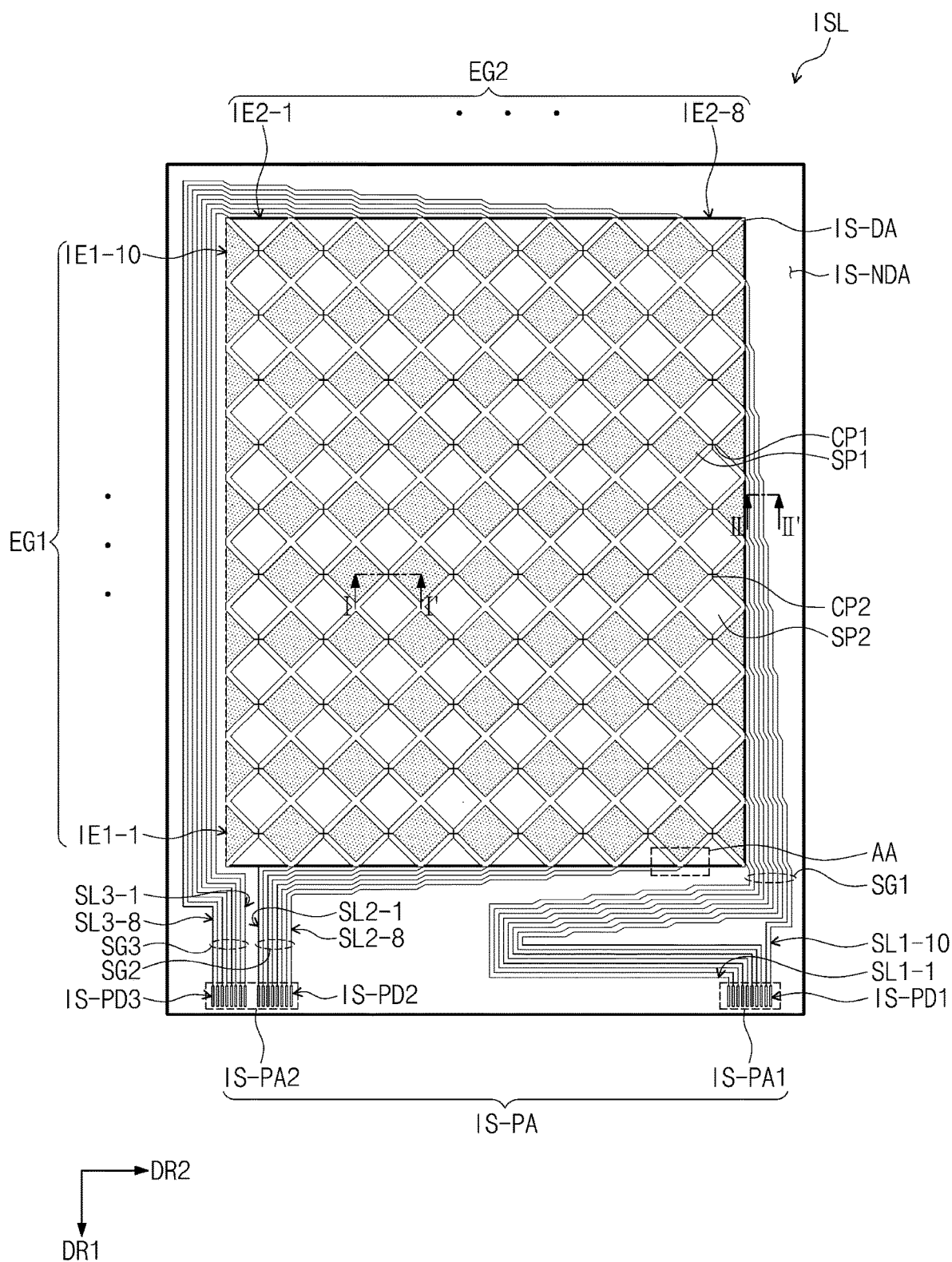
FIG. 6B is a planar view illustrating an input detection sensor according to an exemplary embodiment.
Figure 6C:
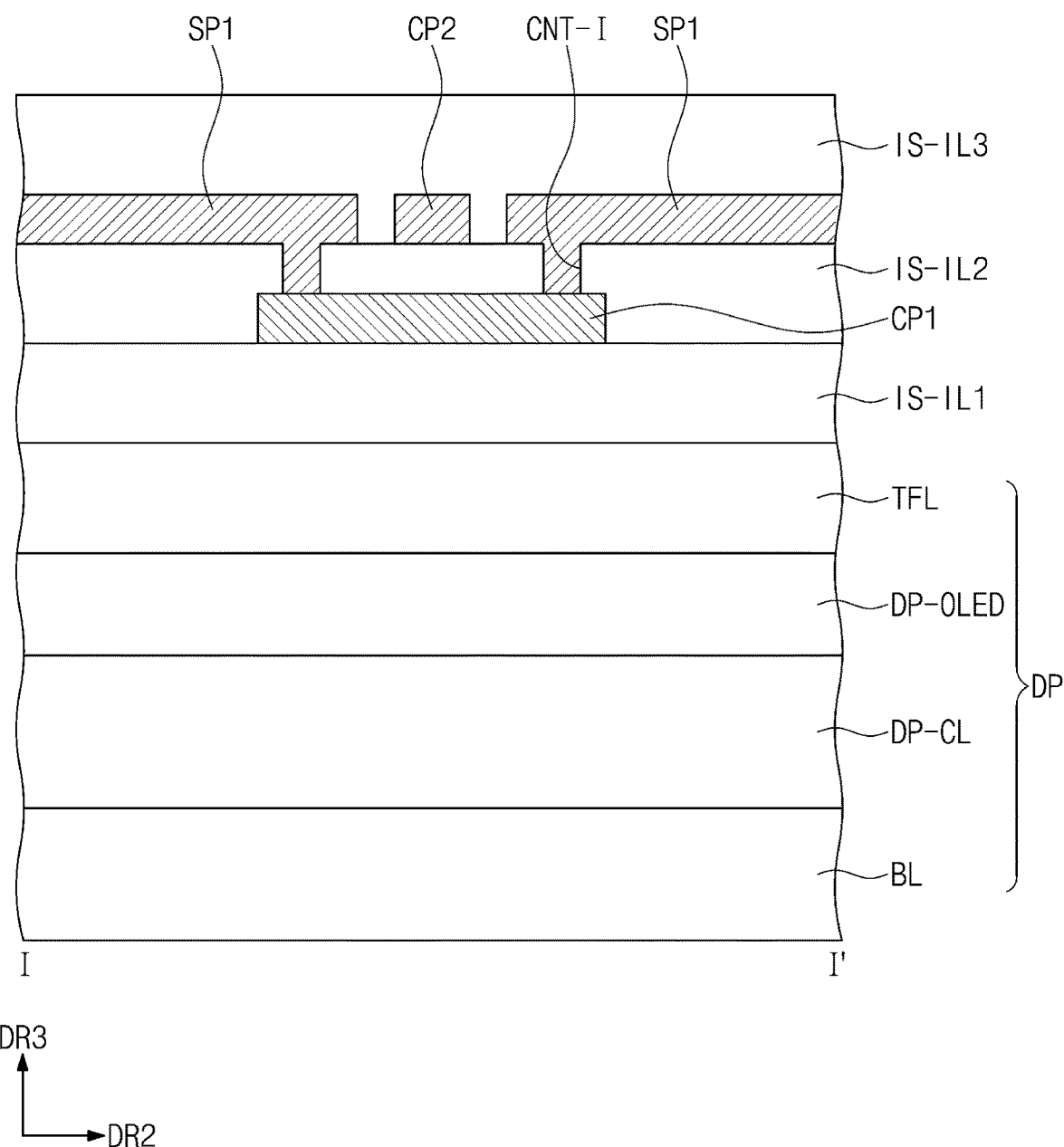
FIG. 6C is a cross-sectional view of the input detection sensor taken along line I-I' of FIG. 6B.
Figure 6D:
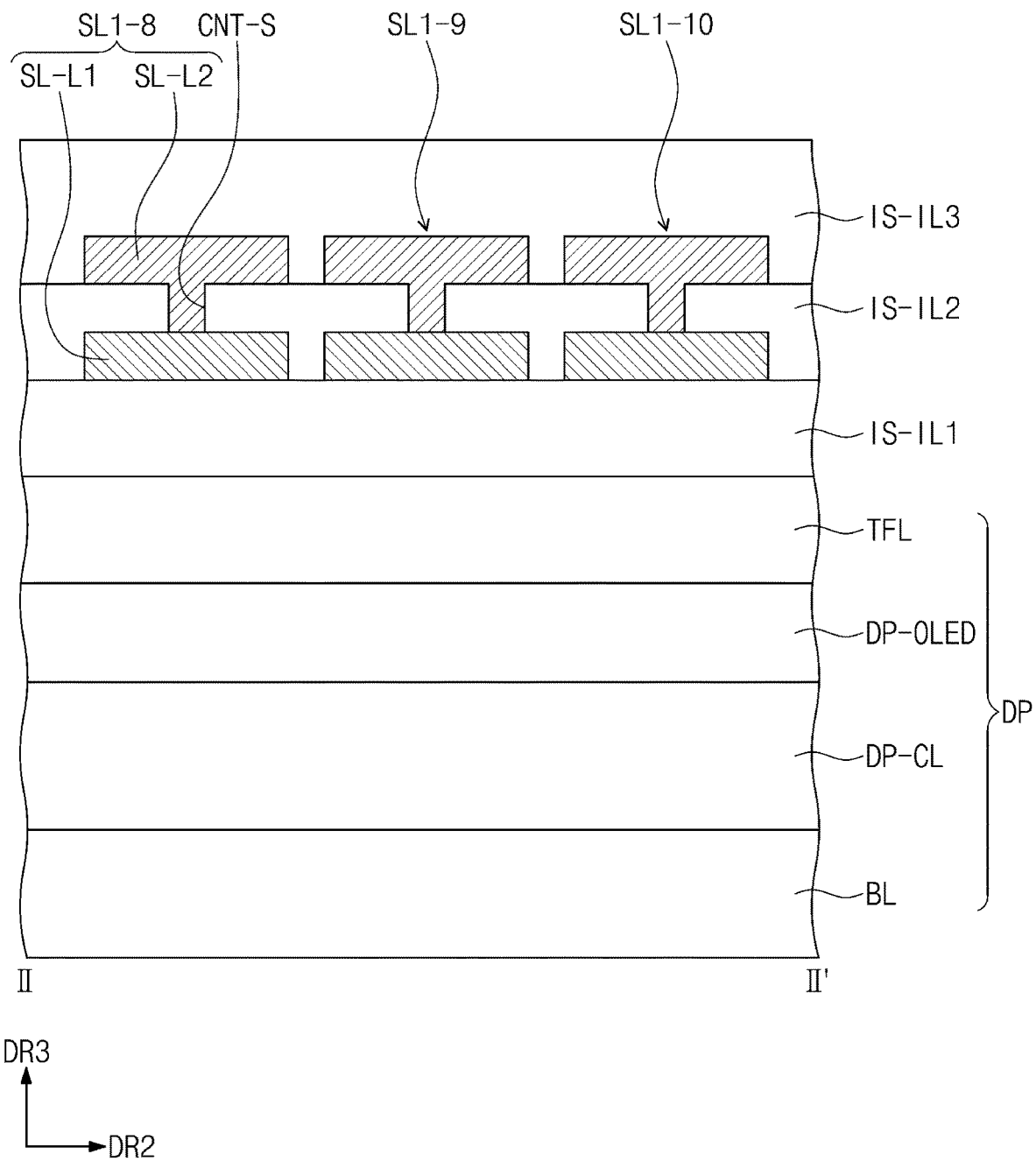
FIG. 6D is a cross-sectional view of the input detection sensor taken along line II-II' of FIG. 6B.
Figure 6E:
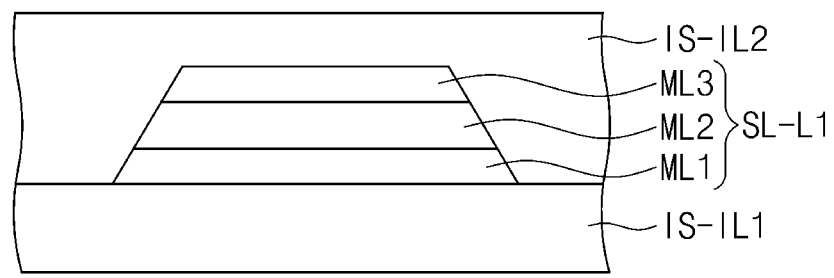
FIG. 6E is a cross-sectional view of a signal line according to an exemplary embodiment.
Figure 6F:
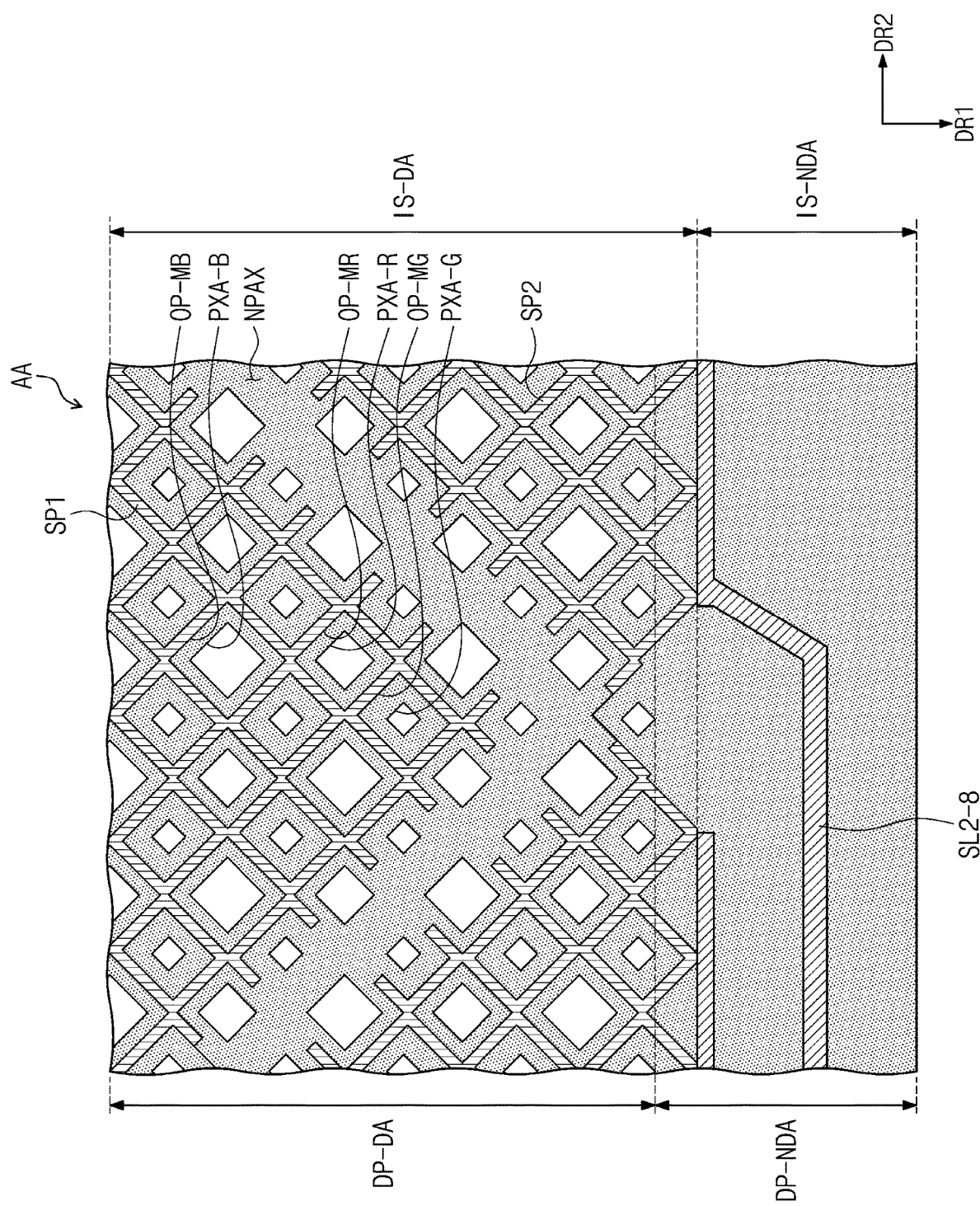
FIG. 6F is an enlarged planar view of region AA of FIG. 6B.

FIG. 6A is a cross-sectional view illustrating the input detection sensor ISL according to an exemplary embodiment. FIG. 6B is a planar view illustrating the input detection sensor ISL according to an exemplary embodiment. FIG. 6C is a cross-sectional view of the input detection sensor taken along line I-I' of FIG. 6B. FIG. 6D is a cross-sectional view of the input detection sensor taken along line II-II' of FIG. 6B. FIG. 6E is a cross-sectional view illustrating a signal line according to an embodiment of the inventive concept. FIG. 6F is an enlarged planar view of region AA of FIG. 6B. Hereinafter, the input detection sensor ISL of a "layer" type will be illustrated according to an exemplary embodiment. The display panel DP is schematically illustrated in FIGS. 6C and 6D.

As illustrated in FIG. 6A, the input detection sensor ISL may include a first insulating layer IS-IL1, a first conductive layer IS-CL1, a second insulating layer IS-IL2, a second conductive layer IS-CL2, and a third insulating layer IS-IL3. The first insulating layer IS-IL1 may be directly disposed on the upper insulating layer TFL. In some exemplary embodiments, the first insulating layer IS-IL1 may be omitted.

Each of the first conductive layer IS-CL1 and the second conductive layer IS-CL2 may have a single-layer structure, or may have a multi-layer structure laminated along the third direction axis DR3. The conductive multi-layer may include at least two among transparent conductive layers and metal layers. The conductive multi-layer may include metal layers including different metals. The transparent conductive layer may include indium tin oxide (ITO), indium zinc oxide (IZO), zinc oxide (ZnO), indium tin zinc oxide (ITZO), PEDOT, metal nanowire, and graphene, etc. The metal layer may include molybdenum, silver, titanium, aluminum, and an alloy thereof. For example, each of the first conductive layer IS-CL1 and the second conductive layer IS-CL2 may have a triple-layer metal layer structure, for example, a triple-layer structure of titanium/aluminum/titanium.

Each of the first conductive layer IS-CL1 and the second conductive layer IS-CL2 includes a plurality of conductive patterns. Hereinafter, the first conductive layer IS-CL1 is described as including first conductive patterns, and the second conductive layer IS-CL2 is described as including second conducive patterns. Each of the first conductive patterns and the second conductive patterns may include sensing electrodes and signal lines connected thereto.

Each of the first to third insulating layers IS-IL1 to IS-IL3 may include an inorganic material or an organic material. The first insulating layer IS-IL1 and the second insulating layer IS-IL2 according to an exemplary embodiment may be inorganic films including inorganic materials. The inorganic films may include at least one of aluminum oxide, titanium oxide, silicon oxide, silicon oxynitride, zirconium oxide, or hafnium oxide. The third insulating layer IS-IL3 may include an organic film. The organic film may include at least one of acrylic resin, methacrylic resin, polyisoprene, vinyl-based resin, epoxy-based resin, urethane-based resin, cellulosic resin, siloxane resin, polyimide-based resin, polyamide-based resin, or perylene-based resin.

As illustrated in FIG. 6B, the input detection sensor ISL may include a sensing region IS-DA and a wiring region IS-NDA or a signal line region IS-NDA respectively corresponding to the display region DP-DA (see FIG. 4) and non-display region DP-NDA (see FIG. 4) of the display panel DP (see FIG. 4). The sensing region IS-DA may be defined as a region in which a first electrode group EG1 and a second electrode group EG2 are arranged.

The input detection sensor ISL may include the first electrode group EG1, the second electrode group EG2, a first signal line group SG1 connected to the first electrode group EG1, and a second signal line group SG2 connected to the second electrode group EG2. A pad region IS-PA, in which signal pads are arranged, is defined in the wiring region IS-NDA. A circuit board may be connected to the pad region IS-PA. In an exemplary embodiment, the pad region DP-PA (see FIG. 4) of the display panel DP and the pad region IS-PA of the input detection sensor ISL may be connected through one circuit board.

The pad region IS-PA may include a first pad region IS-PA1 and a second pad region IS-PA2. First pads IS-PD1 and second pads IS-PD2 are respectively arranged in the first pad region IS-PA1 and the second pad region IS-PA2. The first pads IS-PD1 and the second pads IS-PD2 may be end parts of the signal lines of the first signal line group SG1 and the second signal line group SG2, or may be other electrodes connected to end parts of the signal lines of the first signal line group SG1 and the second signal line group SG2.

The first electrode group EG1 includes first to $i^{th}$ electrodes (where "i" is a natural number equal to or greater than 2). FIG. 10 shows the first electrode group EG1 including first to tenth electrodes IE1-1 to IE1-10 according to an exemplary embodiment. The first to tenth electrodes IE1-1 to IE1-10 have a shape substantially extending in the second direction DR2. The first to tenth electrodes IE1-1 to IE1-10 are arranged in a direction away from the pad region IS-PA in the first direction DR1.

The second electrode group EG2 includes first to $j^{th}$ electrodes (where "j" is a natural number equal to or greater than 2). FIG. 10 shows the second electrode group EG2 including first to eighth electrodes IE2-1 and IE2-8 according to an exemplary embodiment, however, the inventive concepts are not limited to a particular number of electrodes in the first and second electrode groups EG1 and EG2. The first to eighth electrodes IE2-1 to IE2-8 have a shape substantially extending in first direction DR1. The first to eighth electrodes IE2-1 to IE2-8 are sequentially arranged in the second direction DR1. For example, the first electrode IE2-1 is described as being disposed at a leftmost position.

The first signal line group SG1 includes first to $i^{th}$ signal lines. FIG. 10 shows the first signal line group SG1 including first to tenth signal lines SL1-1 and SL1-10 according to an exemplary embodiment. First to tenth signal lines SL1-1 to SL1-10 are respectively connected to one ends of the first to tenth electrodes IE1-1 to IE1-10. As illustrated in FIG. 6B, the first to tenth signal lines SL1-1 to SL1-10 are respectively connected to right ends of the first to tenth electrodes IE1-1 to IE1-10. The first pads IS-PD1 connected to the first to tenth signal lines SL1-1 to SL1-10 may be aligned in the first pad region IS-PA1.

The second signal line group SG2 includes first to $j^{th}$ signal lines. FIG. 10 shows the second signal line group SG2 including first to eighth signal lines SL2-1 to SL2-8 according to an exemplary embodiment. First to eighth signal lines SL2-1 to SL2-8 are respectively connected to one ends of the first to eighth electrodes IE2-1 to IE2-8. As illustrated in FIG. 6B, the first to eighth signal lines SL2-1 to SL2-8 are respectively connected to lower ends of the first to eighth electrodes IE2-1 to IE2-8. The second pads IS-PD2 connected to the first to eighth signal lines SL2-1 to SL2-8 may be aligned in the second pad region IS-PA2.

The input detection sensor ISL may further include a third signal line group SG3 including first to $j^{th}$ signal lines. FIG. 10 shows the third signal line group SG3 including first to eighth signal lines SL3-1 to SL3-8 according to an exemplary embodiment. First to eighth signal lines SL3-1 to SL3-8 are respectively connected to upper ends of the first to eighth electrodes IE2-1 to IE2-8. Third pads IS-PD3 connected to the first to eighth signal lines SL3-1 to SL3-8 may be aligned on a left of the second pads IS-PD2.

Corresponding signal lines of the second signal line group SG2 and the second signal line group SG3 may provide synchronized detection signals to both ends of one electrode. In this manner, sensing sensitivity may be improved by preventing voltage drop of the detection signals. In an exemplary embodiment, at least one of the second signal line group SG2 and the third signal line group SG3 may be omitted.

Electrodes of the first electrode group EG1 may include a plurality of first sensor units SP1 and a plurality of first connection units CP1. The first sensor units SP1 are arranged along the second direction DR2. Each of the first connection units CP1 connects two neighboring first sensor units among the first sensor units SP1.

Electrodes of the second electrode group EG2 include a plurality of second sensor units SP2 and a plurality of second connection units CP2. The second sensor units SP2 are arranged along the first direction DR1. Each of the second connection units CP2 connects two neighboring second sensor units among the second sensor units SP2.

The electrodes of the first electrode group EG1 and the electrodes of the second electrode group EG2 are insulated from each other. FIG. 6B illustrates that the intersection occurs at the first connection unit CP1 and the second connection unit CP2 according to an exemplary embodiment. A portion of the plurality of first sensor units SP1, the plurality of first connection units CP1, the plurality of second sensor units SP2, and the plurality of second connection units CP2 may be formed by patterning the first conductive layer IS-CL1 illustrated in FIG. 6A, and the other portion may be formed by patterning the second conductive layer IS-CL2 illustrated in FIG. 6A.

Referring to FIGS. 6A and 6C, according to an exemplary embodiment, the plurality of first connection units CP1 may be formed from the first conductive layer IS-CL1, and the plurality of first sensor units SP1, the plurality of second sensor units SP2, and the plurality of second connection units CP2 may be formed from the second conductive layer IS-CL2. The first sensor units SP1 and the first connection unit CP1 may be connected through first connection contact holes CNT-I penetrating the second insulating layer IS-IL2.

FIGS. 6B and 6C illustrate that the plurality of first connection units CP1 and the plurality of second connection units CP2 intersect with each other, however, the inventive concepts are not limited thereto. For example, each of the second connection units CP2 may be deformed in a shape of "<" and/or ">" so as not to overlap the first connection units CP1, and overlap the first sensor units SP1.

According to an exemplary embodiment, the signal lines of the first signal line group SG1 and the second signal line group SG2 may have a double-layer structure. A first layer of the double-layer structure may be formed by patterning the first conductive layer IS-CL1 illustrated in FIG. 6A, and a second layer may be formed by patterning the second conductive layer IS-CL2 illustrated in FIG. 6A.

Referring to FIG. 6D, the eighth to tenth signal lines SL1-8 to SL1-10 includes a first layer SL-L1 and a second layer SL-L2. The first layer SL-L1 and the second layer SL-L2 are connected through second connection contact holes CNT-S penetrating the second insulating layer IS-IL2.

As illustrated in FIG. 6E, the first layer SL-L1 may include a metallic multilayer. The second layer SL-L2 may also include a metallic multi-layer. FIG. 6E exemplarily illustrates the first layer SL-L1 having a triple-layer structure including a first metal layer ML1, a second metal layer ML2, and a third metal layer ML3 according to an exemplary embodiment. The first metal layer ML1, the second metal layer ML2, and the third metal layer ML3 may be a first titanium layer ML1, an aluminum layer ML2, and a second titanium layer ML3. The second layer SL-L2 may have substantially the same laminate structure as the first layer SL-L1. In some exemplary embodiments, at least one of the first layer SL-L1 and the second layer SL-L2 may include an additional conductive layer therein.

Referring to FIGS. 6C to 6E, the first layer SL-L1 and the first connection unit CP1 may be formed through the same process to have the same laminate structure, and the second layer SL-L2 and the second connection unit CP2 may be formed through the same process to have the same laminate structure.

FIG. 6F illustrates the region AA of FIG. 6B. According to an exemplary embodiment, the electrodes of the first electrode group EG1 and the electrodes of the second electrode group EG2 may have a substantially mesh shape. FIG. 6F illustrates a part of a mesh-type first electrode IE1-1 and a part of a mesh-type second electrode IE2-8, in which openings OP-MR, OP-MG, and OP-MB corresponding to three types of light emission regions PXA-R, PXA-G, and PXA-B are defined.

According to an exemplary embodiment, the input detection sensor ISL may be a capacitive touch panel for sensing an external input based on mutual capacitance. Either of the first electrode group EG1 or the second electrode group EG2 may receive a detection signal, and the other one may output a variation in capacitance between the first electrode group EG1 and the second electrode group EG2 as an output signal.

In an exemplary embodiment, the electrodes of the second electrode group EG2 may sequentially receive the detection signal. An input sensing circuit may read the output signal from the first electrode group EG1. When an input event occurs at a specific position, the output signal may include a capacitance variation that is different when an input event has not occurred. For example, when an input event occurs (or when the input means is input) at the specific position, an additional capacitor may be connected in parallel to capacitors defined by the electrode of the first electrode group EG1 and the electrode of the second electrode group EG2 at the specific position in an equivalent circuit.

The first to tenth signal lines SL1-1 to SL1-10 may have substantially the same resistance to reduce noise caused by the first signal line group SG1 during a process of reading the output signal from the first electrode group EG1 through the first signal line group SG1. As used herein, the term "substantially the same resistance" encompasses a resistance deviation occurring due to a process error, even though the signal lines are designed to have the same resistance. Even if the first to tenth signal lines SL1-1 to SL1-10 may not have the same resistance, at least a portion of the first to tenth signal lines SL1-1 to SL1-10 may have the features described below to reduce the deviation therebetween.

Figure 7A:
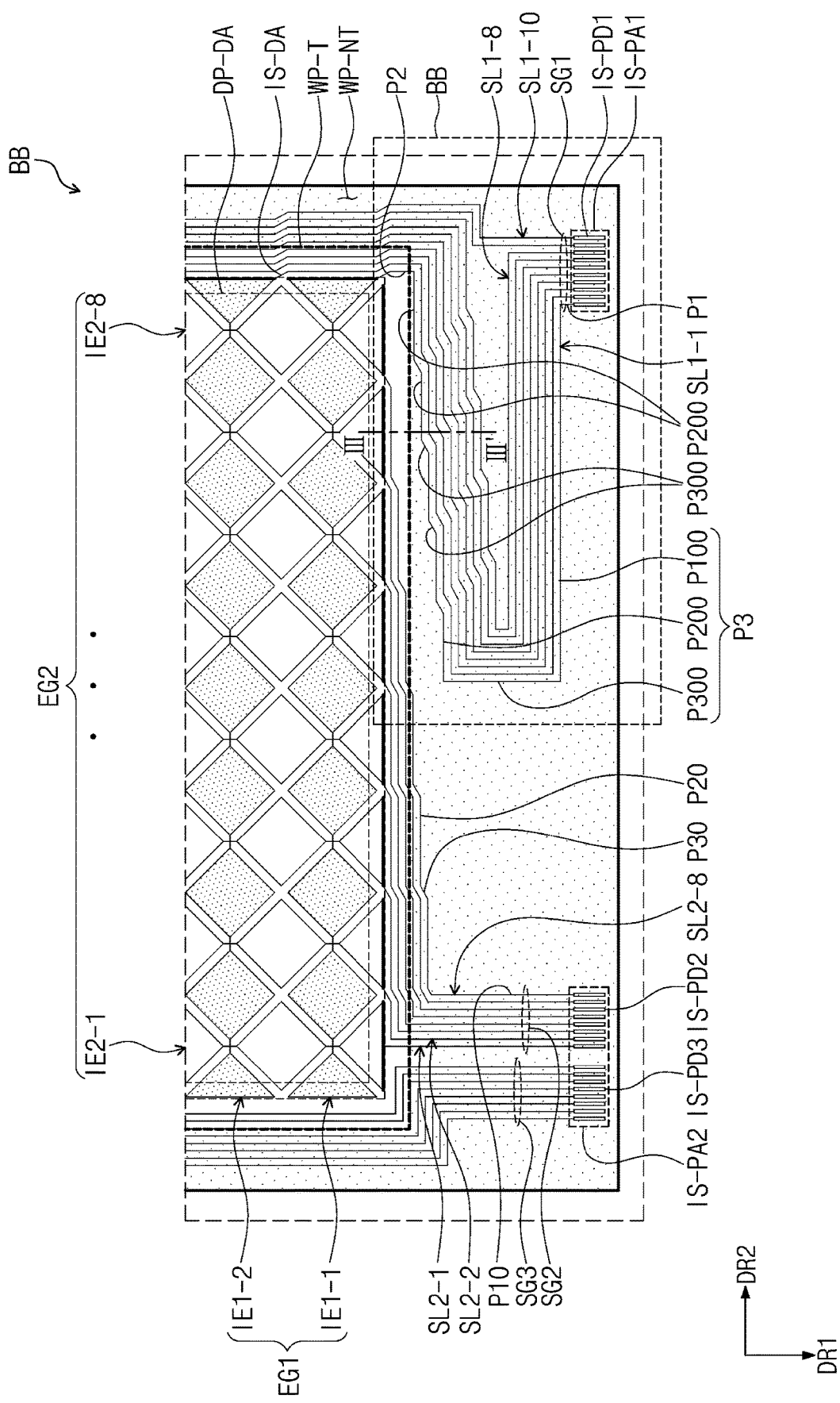
FIG. 7A is an enlarged planar view of a part of an input detection sensor according to an exemplary embodiment.
Figure 7B:
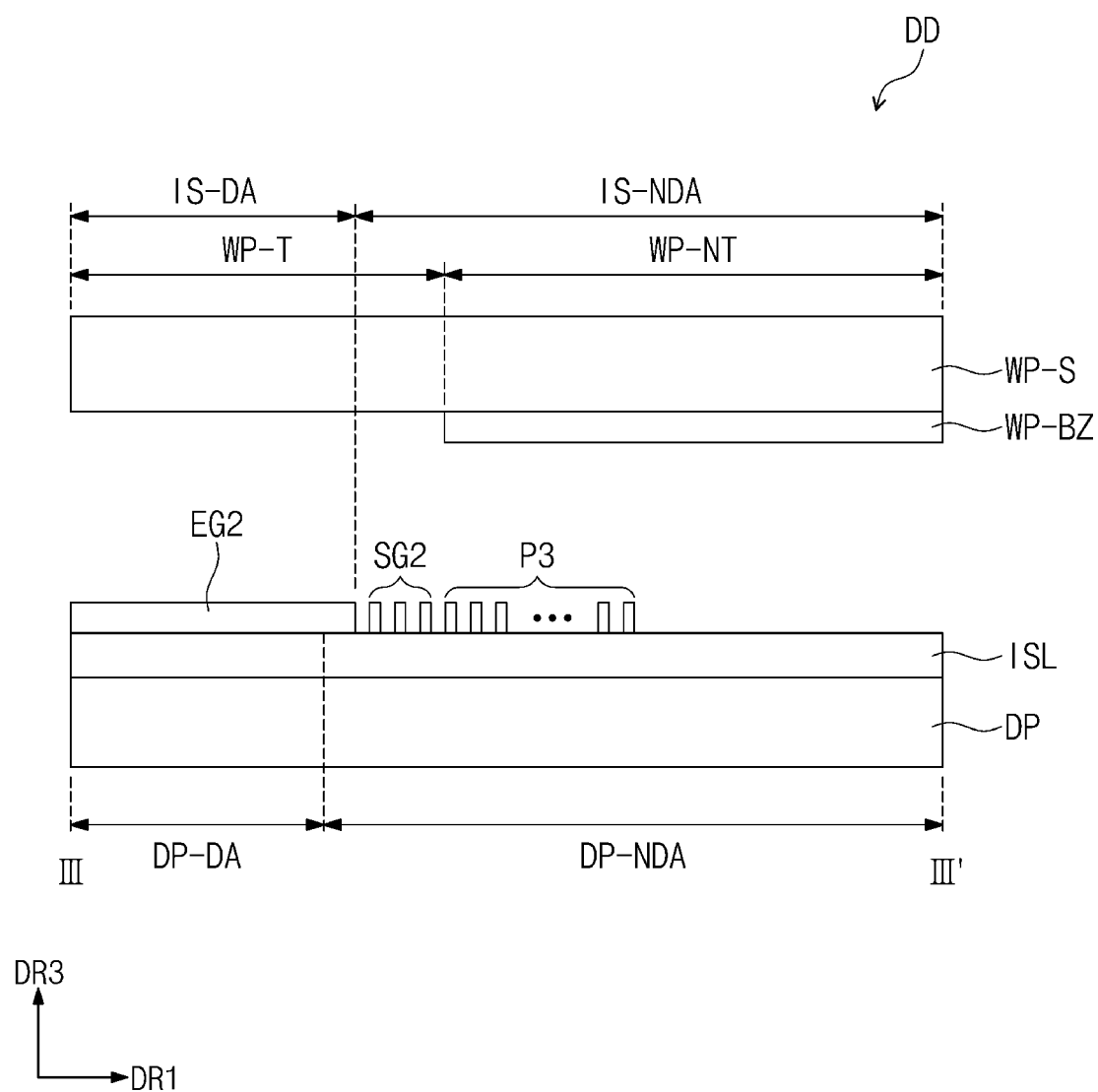
FIG. 7B is a cross-sectional view of the display device taken along line III-III' of FIG. 7A.
Figure 7C:
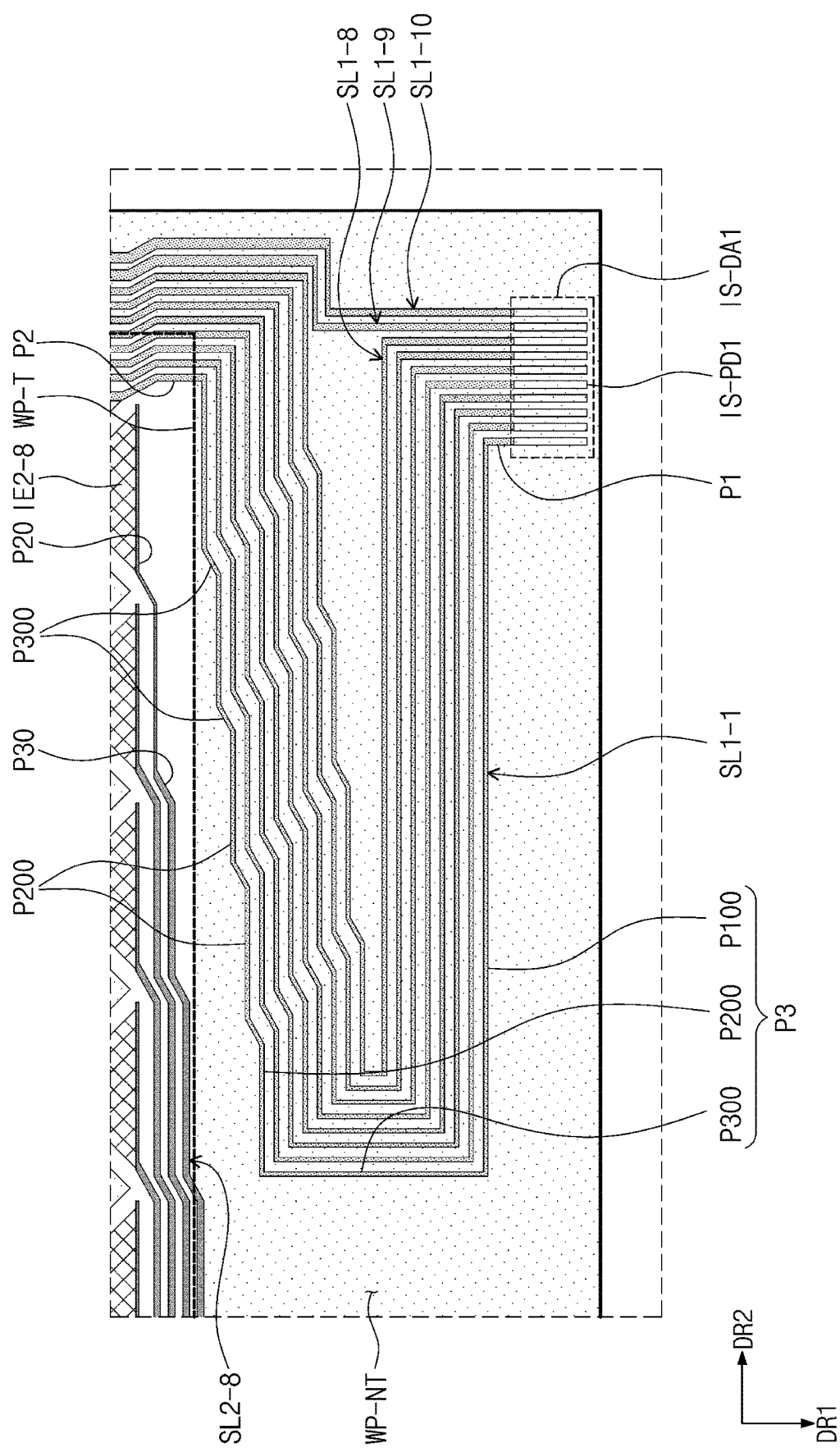
FIG. 7C is an enlarged planar view of region BB of FIG. 7A.

FIG. 7A is an enlarged planar view of a part of the input detection sensor ISL according to an exemplary embodiment. FIG. 7B is a cross-sectional view illustrating the display device DD taken along line III-III' of FIG. 7A. FIG. 7C is an enlarged planar view of region BB of FIG. 7A. The following descriptions are provided with reference to FIGS. 7A to 7C and the entire planar view of the input detection sensor ISL of FIG. 6B.

FIG. 7B illustrates relative positions of the transmission region WP-T, the display region DP-DA, and the sensing region IS-DA. The planar region of a part of the input detection sensor ISL shown in FIG. 7A will be described with reference to the regions illustrated in FIG. 7B. In FIG. 7B, a distance between the transmission region WP-T and the sensing region IS-DA may be several hundred of micrometers, for example, about 300 μm to about 500 μm.

As illustrated in FIGS. 7A and 7B, some signal lines among the first to $j^{th}$ signal lines of the second signal line group SG2 may include a first part P10 (or a connection part), a second part P20 (or an extension part), and a third part P30 (or an intermediate part). In an exemplary embodiment, the second to eighth signal lines SL2-2 to SL2-8 may include the first part P10, the second part P20, and the third part P30. The second to eighth signal lines SL2-2 to SL2-8 may include a greater number of the second parts P20 and a greater number of the third parts P30 in the increasing order of the second to eight single lines SL2-2 to SL2-8.

The first part P10 is connected to the corresponding second pad IS-PD2 and extends in the first direction DR1. The second part P20 extends a signal line in the second direction DR2. A signal line is bent at the third part P30.

The eighth signal line SL2-8, which is a $j^{th}$ signal line, is disposed farthest away from the first electrode IE2-1 of the second electrode group EG2 in the first direction DR1. The eighth signal line SL2-8 may include "m" number of second parts P20 and "m−1" number of third parts P30. Here, "m" may be a natural number equal to or greater than 2, and be equal to or less than "j". For example, the eight signal line SL2-8 may include seven second parts P20 and sixth third parts 30. A portion of the seven second parts P20 of the eighth signal line SL2-8 may overlap the light shielding region WP-NT. For example, two of the seven second parts P20 may overlap the light shielding region WP-NT.

The "m" number of the second parts P20 are disposed closer to the sensing region IS-DA as the order thereof increases. The seventh second part P20 may be connected to the eighth second electrode IE2-8.

In this manner, a width of a region, in which the second to eighth signal lines SL2-2 to SL2-8 are arranged, as measured in the first direction DR1 may be gradually decreased in the second direction DR2 towards the first signal line group SG1.

Referring to FIGS. 7A and 7C, the signal lines of the second signal line group SG2 may have different line widths according to a region. In particular, a region of a signal line that is closer to a corresponding electrode may have a smaller line width than other regions of the signal line. For example, among the seven second parts P20 of the eighth signal line SL2-8, several second parts P20 more adjacent to the eighth second electrode IE2-8 may have a smaller width than those of the other second parts P20 more adjacent to the first part P10.

FIG. 7A illustrates the eighth signal line SL2-8 as including seven third parts P30, however, in some exemplary embodiments, the first third part P30 connected to the first part P10 may be omitted. In this case, the second part P20 may be directly connected to the first part P10. In the illustrated exemplary embodiment, the third parts P30 extend substantially in a diagonal direction intersecting with the first direction DR1 and the second direction DR2, however, in some exemplary embodiments, the third parts P30 may extend substantially in the first direction DR1.

As illustrated in FIGS. 7A and 7B, each of the first to $n^{th}$ signal lines (where "n" is a natural number equal to or greater than 1 and less than i), among the first to $i^{th}$ signal lines of the first signal line group SG1, may include a first part P1, a second part P2, and a third part P3. For example, the "n" number according to an exemplary embodiment may be 8.

The first parts P1 of the first to eighth signal lines SL1-1 to SL1-8 extend substantially in the first direction DR1 from the first pad region IS-PA1. The first parts P1 are not necessarily required to extend linearly. The second parts P2 of the first to eighth signal lines SL1-1 to SL1-8 are respectively connected to the first to eighth electrodes IE1-1 to IE1-8 (see FIG. 6B). The second parts P2 extend substantially in the first direction DR1, but are not necessarily required to extend linearly. The second parts P2 may have shapes similar to shapes of the second to eighth signal lines SL2-2 to SL2-8 of the second signal line group SG2.

In an exemplary embodiment, relatively longer second parts P2 may have a greater line width than relatively shorter second parts P2. The line width of the second part P2 of the first signal line SL1-1 may be less than the line width of the second part P2 of the eighth signal line SL1-8. FIG. 7C illustrates the second parts P2 of two outermost first signal lines SL1-9 and SL1-10 as being thicker than the other second parts P2.

The third parts P3 of the first to eighth signal lines SL1-1 to SL1-8 are arranged between the first part P1 and the second parts P2. The third parts P3 may have an open loop shape.

The third parts P3 may have a shape bent multiple times in order to increase a length in a narrow region. The third parts P3 may have the same line width to control a resistance value by length. A portion of the signal lines of the second signal line group SG2, for example, the eighth signal line SL2-8, may be arranged between the third parts P3 and the sensing region IS-DA.

The first to eighth signal lines SL1-1 to SL1-8 include the third parts P3 having different lengths. The lengths of the third parts P3 may be decreased with an increasing order of the signal lines SL1-1 to SL1-8.

The resistances of the third parts P3 may decrease with an increasing order of the signal lines SL1-1 to SL1-8. Here, the resistances of the second parts P2 extending from the third parts P3 increase with an increasing order of the signal lines SL1-1 to SL1-8.

The third parts P3 are densely arranged in a narrow region to reduce an area of the wiring region IS-NDA. The line widths of the third parts P3 may be several micrometers, and a distance between the third parts P3 may be several micrometers, for example. In an exemplary embodiment, the line widths of the third parts P3 and the distance between neighboring third parts P3 may be about 3 µm to about 7 µm.

Since pieces of wirings are highly densely arranged in a narrow area, a scattering phenomenon of incident light may be increased on the third parts P3. The third parts P3 may also include a metallic triple-layer structure illustrated in FIG. 6E, since a side surface of the metallic layer has a high density in a region in which the third parts P3 are arranged.

Referring back to FIG. 6E, the third metal layer ML3 may have a lower reflectance than the second metal layer ML2, and covers substantial portions of the second metal layer ML2 except an inclined side surface of the second metal layer ML2. In this case, external light may be scattered on the inclined side surface of the second metal layer ML2.

According to an exemplary embodiment, at least a portion of the third parts P3 overlaps the light shielding pattern WP-BZ to prevent the third parts P3 being viewed by a user due to the scattered light. The light shielding pattern WP-BZ may block the scattered light from being emitted externally.

The third parts P3 may fully overlap the light shielding pattern WP-BZ, but are not limited thereto. In some exemplary embodiments, a portion of the third parts P3 may not overlap the light shielding pattern WP-BZ.

Referring to FIG. 7C, the third parts P3 may have a smaller line width than the first and second parts P1 and P2. As such, the third parts P3 may be more densely arranged than the first and second parts P1 and P2 in the same area.

Referring to FIGS. 7A and 7C, each of the third parts P3 includes a base part P100, an extension part P200, and an intermediate part P300. The base part P100 extends from one end of a corresponding first part P1 towards the first part P10 of the second signal line group SG2 in the second direction DR2.

The third parts P3 may include different numbers of the extension parts P200. The extension part P200 is spaced apart from the base part P100 substantially in the first direction DR1. The third part P3 of the first signal line SL1-1 may include first to $k^{th}$ extension parts P200 (where "k" is a natural number equal to or greater than 2). The "k" number of extension parts P200 may be arranged in the second direction DR2. The first to $k^{th}$ extension parts P200 are spaced farther apart from the base part P100 as an order of the first to $k^{th}$ extension parts P200 increases. For example, the "k" number according to an exemplary embodiment may be 5.

The third parts P3 may include different numbers of the intermediate parts P300. The intermediate parts P300 may extend in a direction substantially diagonal to or substantially perpendicular to the extension parts P200. The third part P3 of the first signal line SL1-1 may include first to $k^{th}$ intermediate parts P300. The first intermediate part P300 is disposed between one end of the base part P100 and the first extension part P200 of the third part P3. The second to $k^{th}$ intermediate parts P300 connect the first to $k^{th}$ extension parts P200. The first intermediate part P300 may have a greater length than the other intermediate parts P300.

The base parts P100 may correspond to the first to $k^{th}$ intermediate parts P300. Distances between the base parts P100 and the sensing region IS-DA may be substantially constant.

In an inner region defined by the base part P100, the extension part P200, and the intermediate part P300 of the first signal line SL1-1, the third parts P3 of another signal line may be arranged. As such, a width of a region, in which the third parts P3 are arranged, as measured in the first direction DR1 may be gradually decreased in the second direction DR2 towards the first parts P10 of the second signal line group SG2. Since the third parts P3 are arranged in a region in which the second signal line group SG2 is not arranged, the area of the wiring region IS-NDA may be reduced. Since the third parts P3 substantially extend in the second direction DR2, the third parts P3 may be spaced far apart from the sensing region IS-DA. In this manner, the area of the third parts P3 overlapping the light shielding region WP-NT may be increased.

Figure 8A:
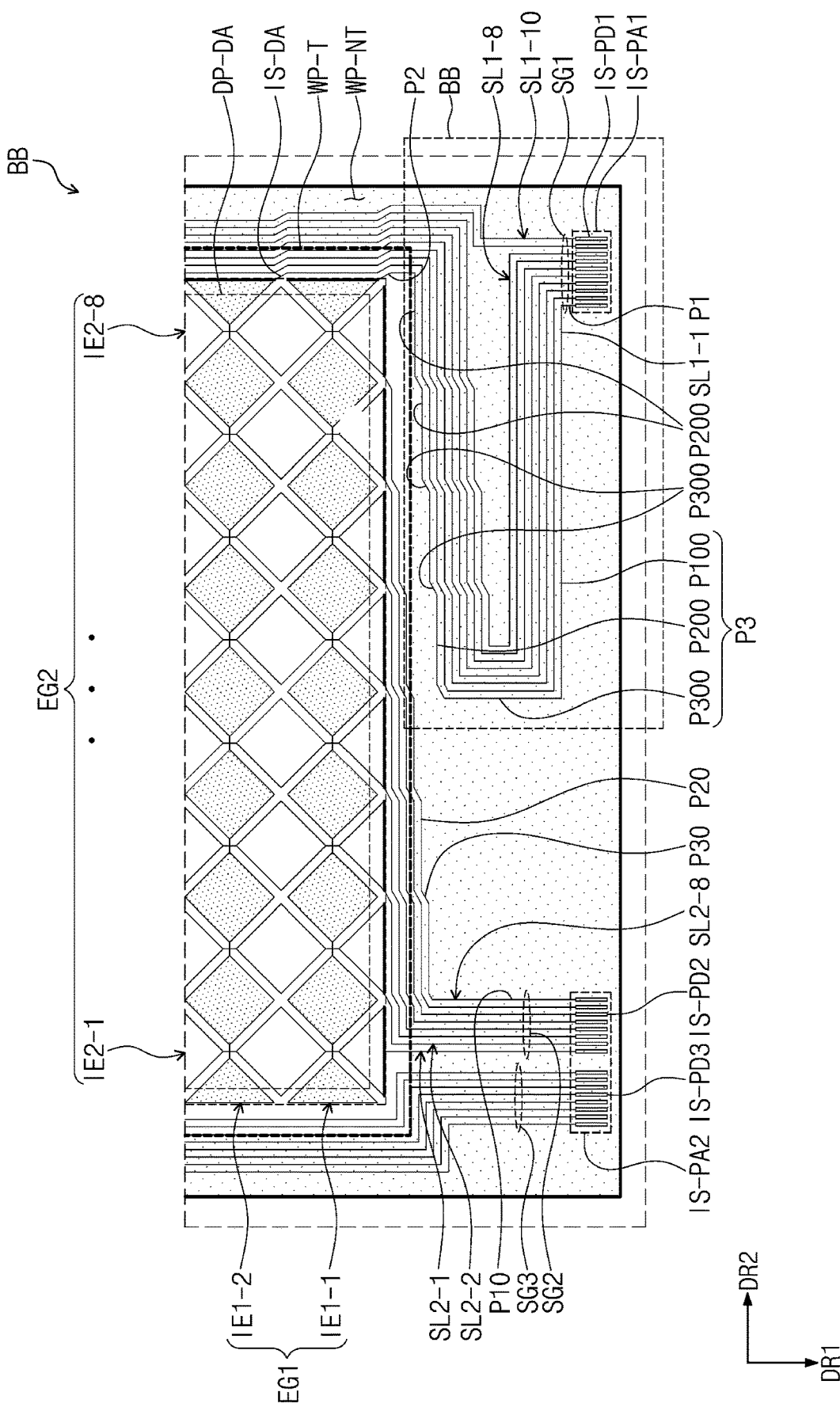
FIG. 8A is an enlarged planar view of a part of an input detection sensor according to an exemplary embodiment.
Figure 8B:
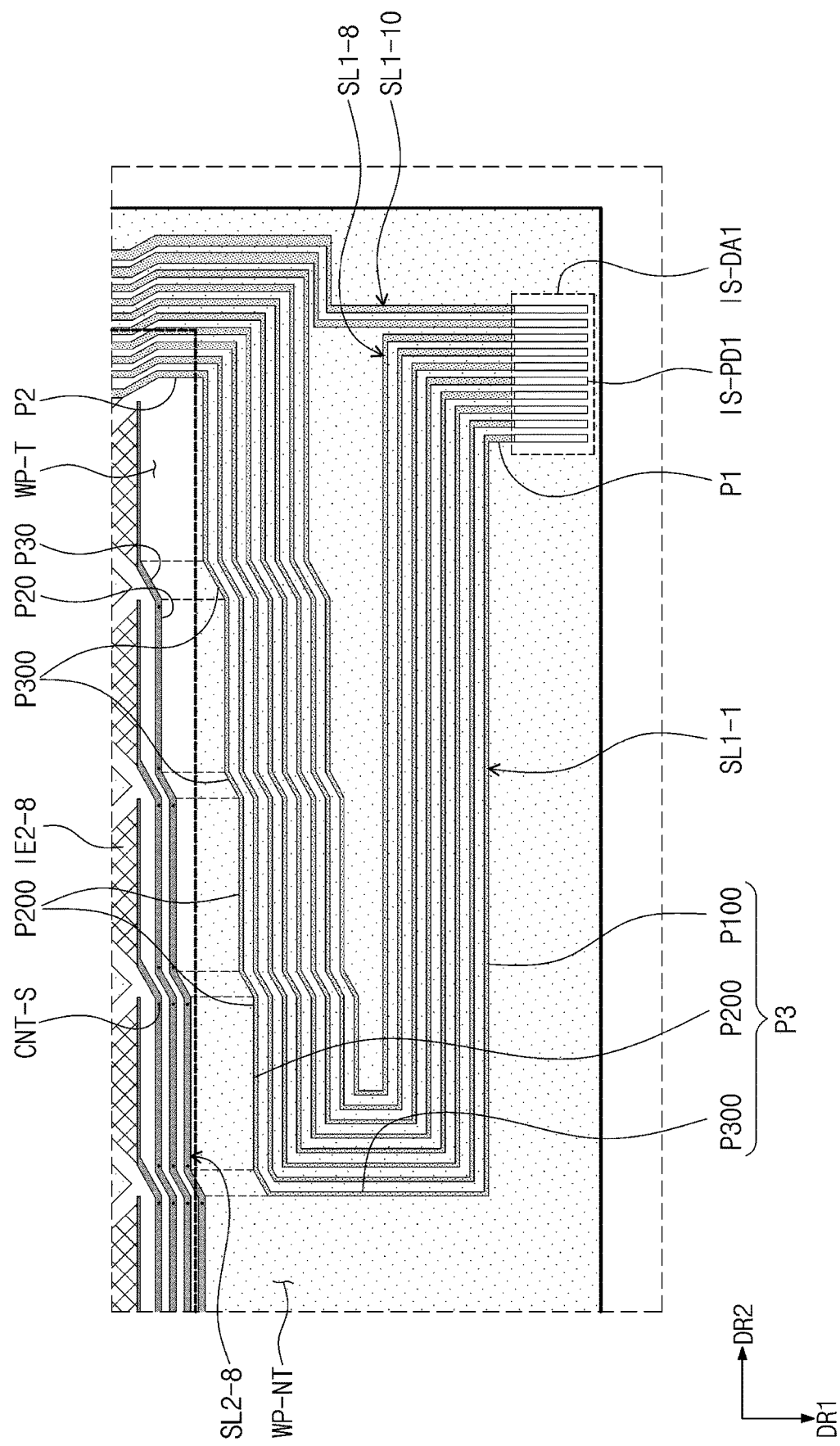
FIG. 8B is an enlarged planar view of a part of FIG. 8A.
Figure 8C:
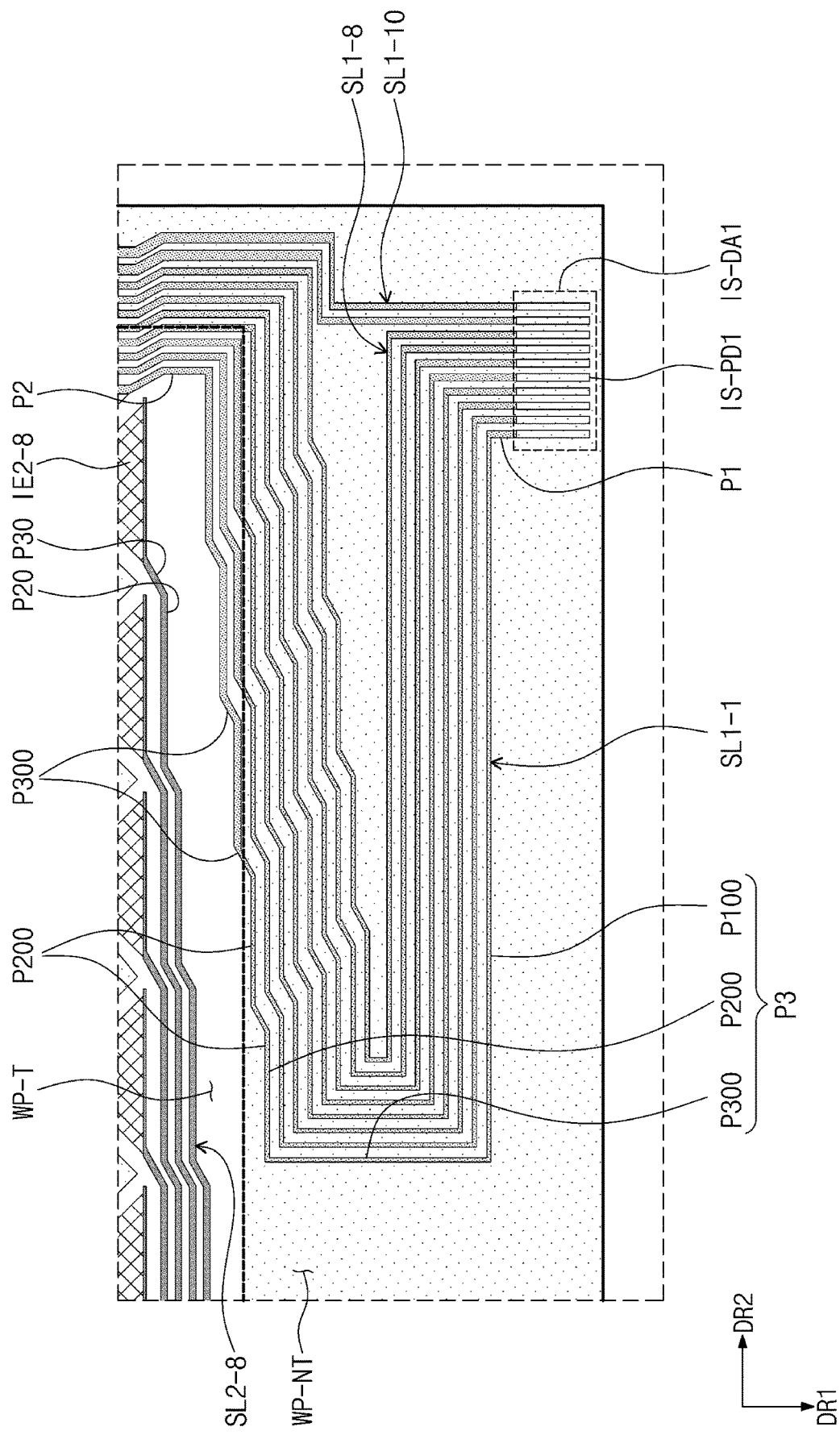
FIG. 8C is an enlarged planar view of a part of an input detection sensor according to an exemplary embodiment.

FIG. 8A is an enlarged planar view of a part of an input detection sensor according to an exemplary embodiment. FIG. 8B is an enlarged planar view of a part of FIG. 8A. FIG. 8C is an enlarged planar view of a part of an input detection sensor according to an exemplary embodiment. Hereinafter, detailed descriptions of substantially the same elements and configurations as described above with reference to FIGS. 1 to 7C will be omitted to avoid redundancy.

As illustrated in FIGS. 8A and 8B, the intermediate parts P300 of the third parts P3 are arranged in correspondence with the third parts P30 of the second signal line group SG2, and the extension parts P200 of the third parts P3 are arranged in correspondence with the second parts P20 of the second signal line group SG2. The third parts P3 and the second signal line group SG2 are arranged so that shapes of the third parts P3 in a planar view interlock with shapes of a portion of the signal lines of the second signal line SG2 in a planar view. Since the third parts P3 and the signal lines of the second signal line group SG2 are arranged to interlock with each other, the area of the wiring region IS-NDA may be reduced (see FIG. 6B).

Since the third parts P3 and the signal lines of the second signal line group SG2 are arranged to interlock with each other, a visual inspection can be facilitated. FIG. 8B illustrates an enlarged view of a region corresponding to one intermediate part P300. According to the illustrated exemplary embodiment, since the third parts P3 and the intermediate part P300 are linearly formed without being bent in this region, a visual inspection may be conducted substantially simultaneously. In particular, the third parts P3 and the intermediate part P300 illustrated in FIGS. 8A and 8B may provide an area enough to carry out the visual inspection. For example, an image of the region corresponding to FIG. 8B is captured, and a noise is detected from the captured image. The noise may be determined as a defect of a signal line.

FIG. 8B illustrates the second connection contact holes CNT-S described with reference to FIG. 6D. The second connection contact holes CNT-S are arranged in an end region of the second part P20. The end region may be a region corresponding to about 0% to about 10% and about 90% to about 100% of the length of one second part P20 in the second direction DR2. The second contact holes CNT-S may be determined as a noise during a visual inspection. As such, the second connection contact holes CNT-S may not be arranged in a center region of the second part P20, and the center region of the second part P20 may be used as a visual inspection region.

Referring to FIG. 8C, portions of the third parts P3 may not overlap the light shielding region WP-NT. In a planar view, the $(k-1)^{th}$ and $k^{th}$ extension parts P200 of the third part P3 of the first signal line SL1-1 may not overlap the light shielding region WP-NT. Referring to FIG. 8C, k may be 5, for example. The first and second extension parts P200 of the third part P3 of the first signal line SL1-1 may overlap the light shielding region WP-NT.

A portion of the third parts P3, which does not overlap the light shielding region WP-NT, may have a greater line width than a portion which overlaps the light shielding region WP-NT. A region on which the third parts P3 with a greater line width are disposed may have a relatively low scattering ratio of external light, because the density of the side surface of the metal layer described with reference to FIG. 6E is low.

Figure 9A:
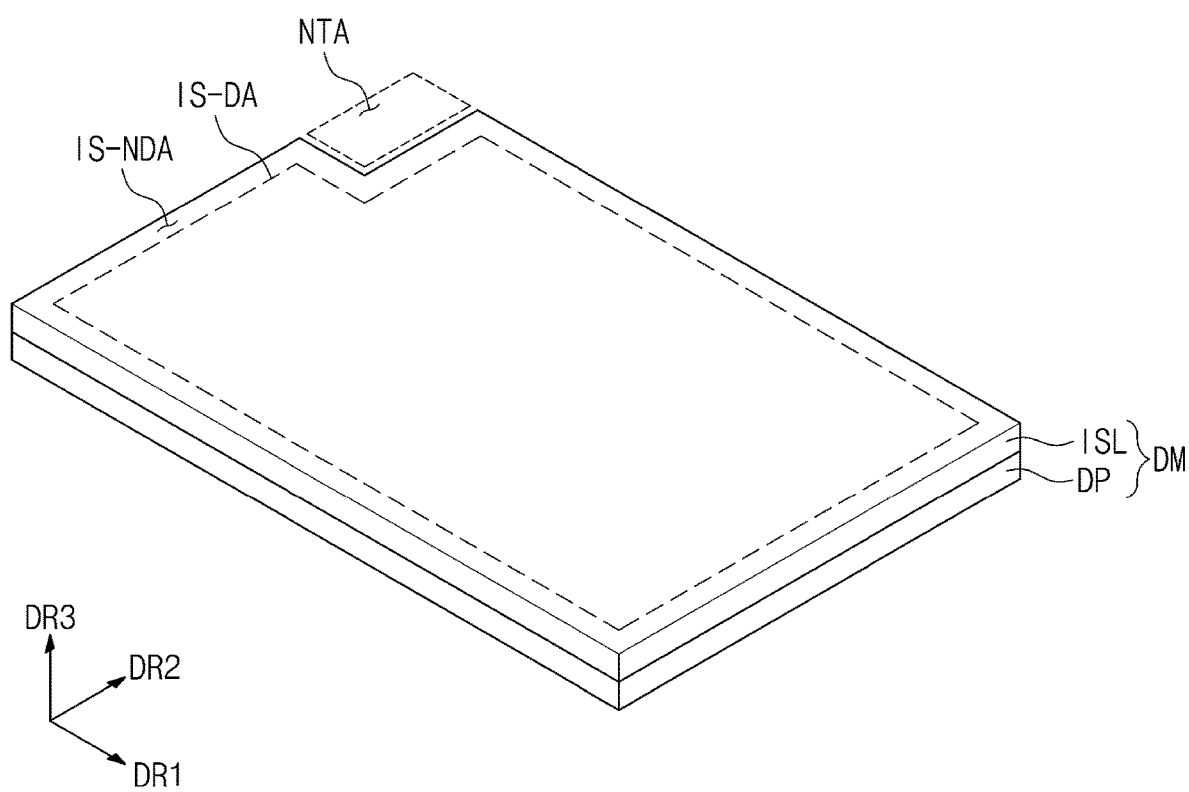
FIG. 9A is a perspective view of a display module according to an exemplary embodiment.
Figure 9B:
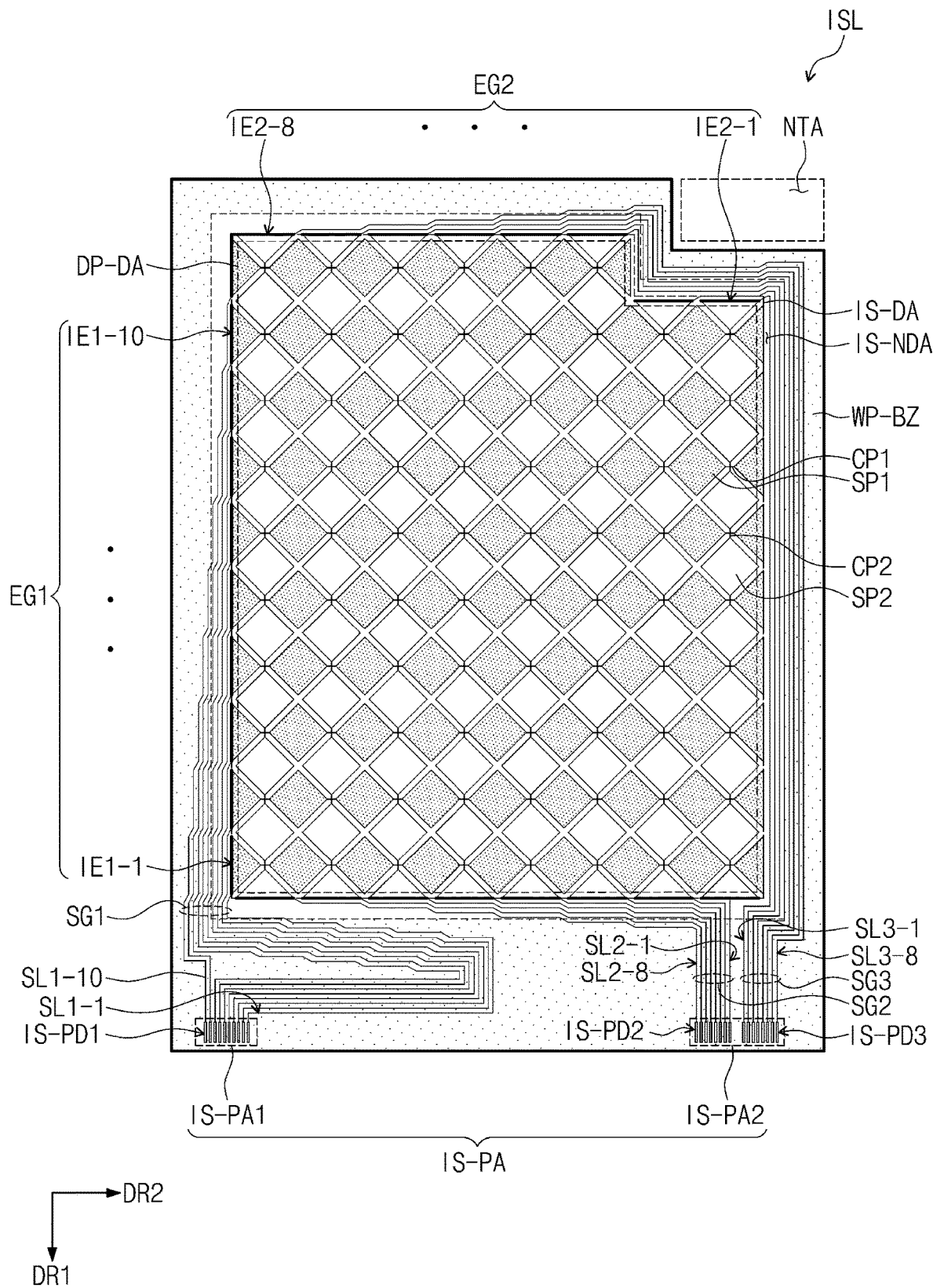
FIG. 9B is a planar view illustrating an input detection sensor according to an exemplary embodiment.
Figure 10A:
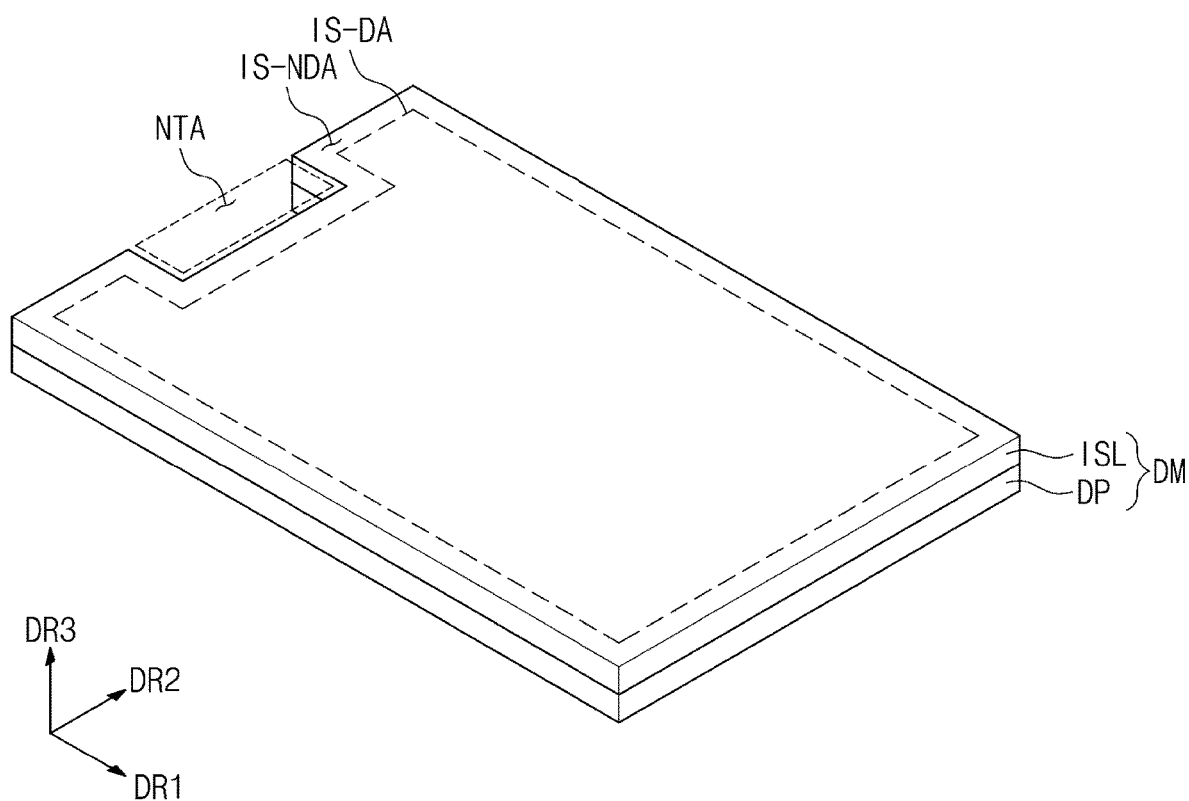
FIG. 10A is a perspective view of a display module according to an exemplary embodiment.
Figure 10B:
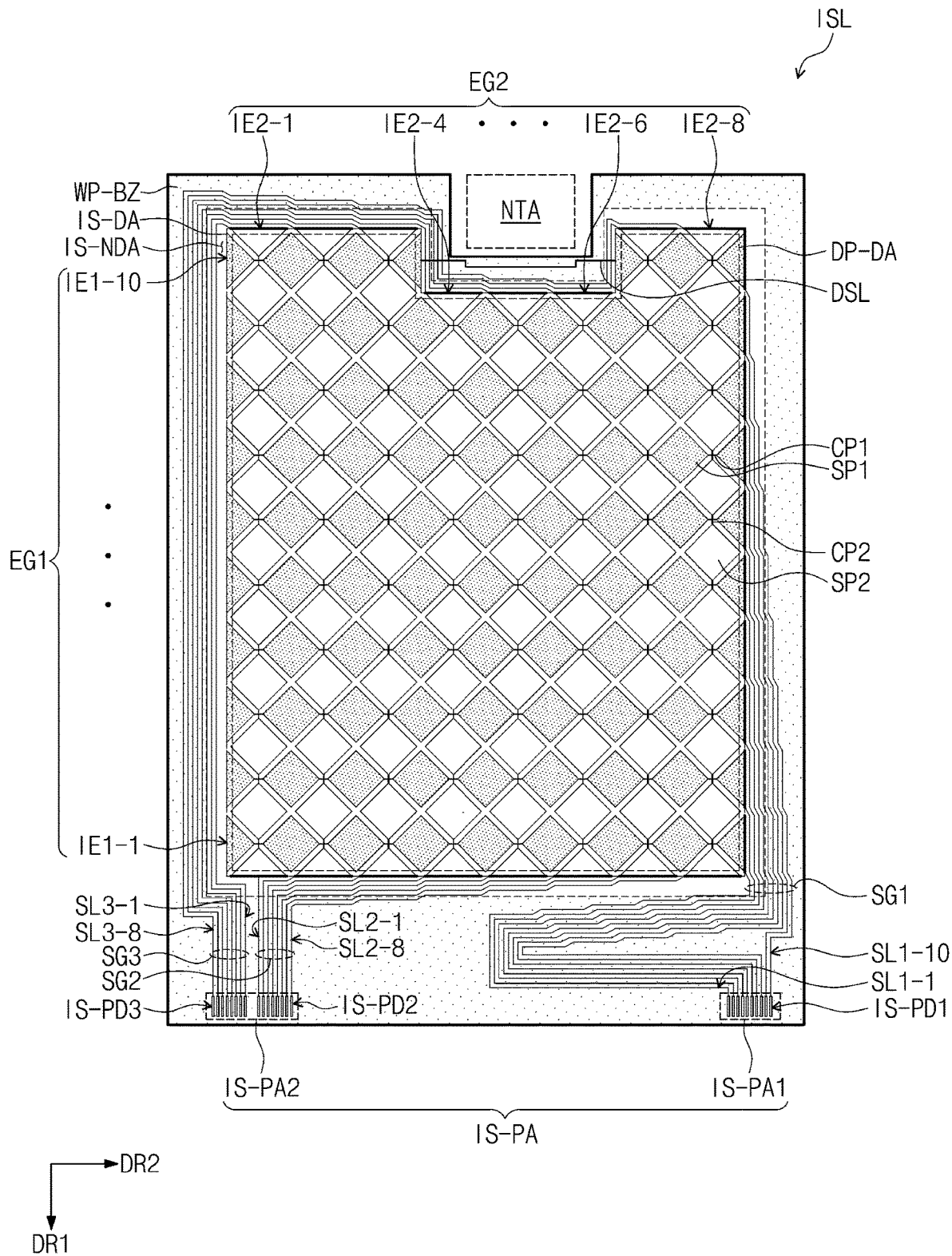
FIG. 10B is a planar view illustrating an input detection sensor according to an exemplary embodiment.
Figure 11A:
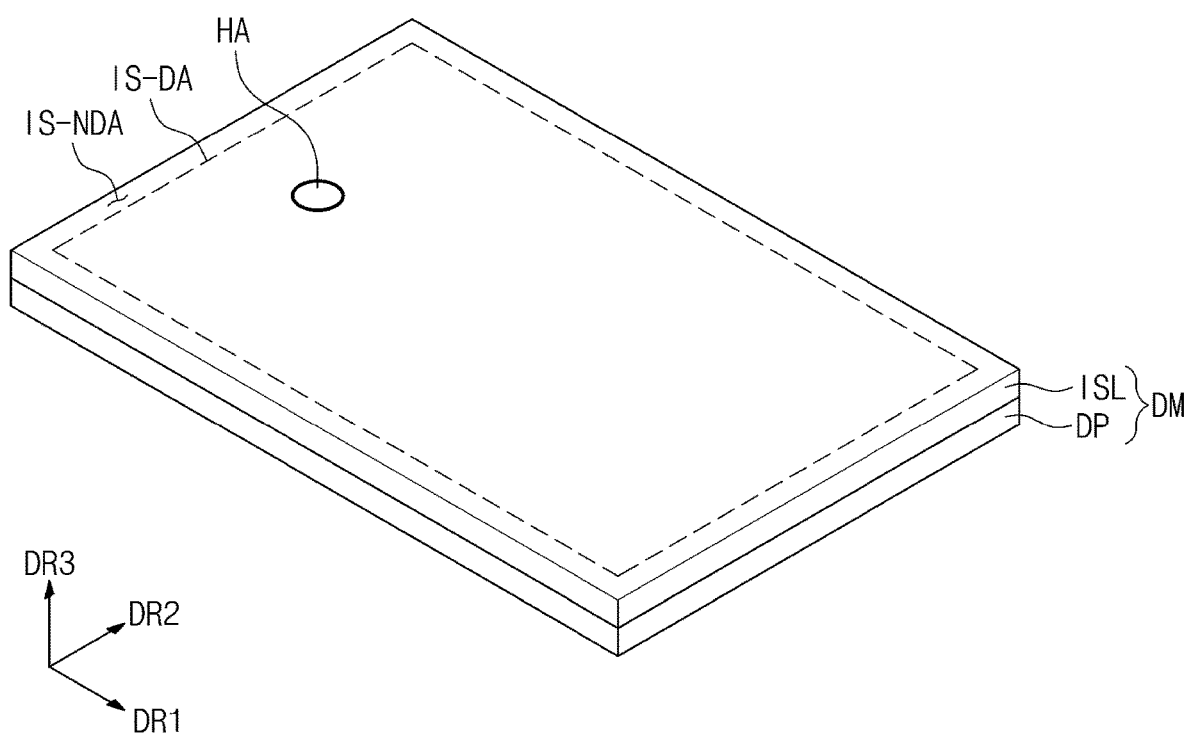
FIG. 11A is a perspective view of a display module according to an exemplary embodiment.
Figure 11B:
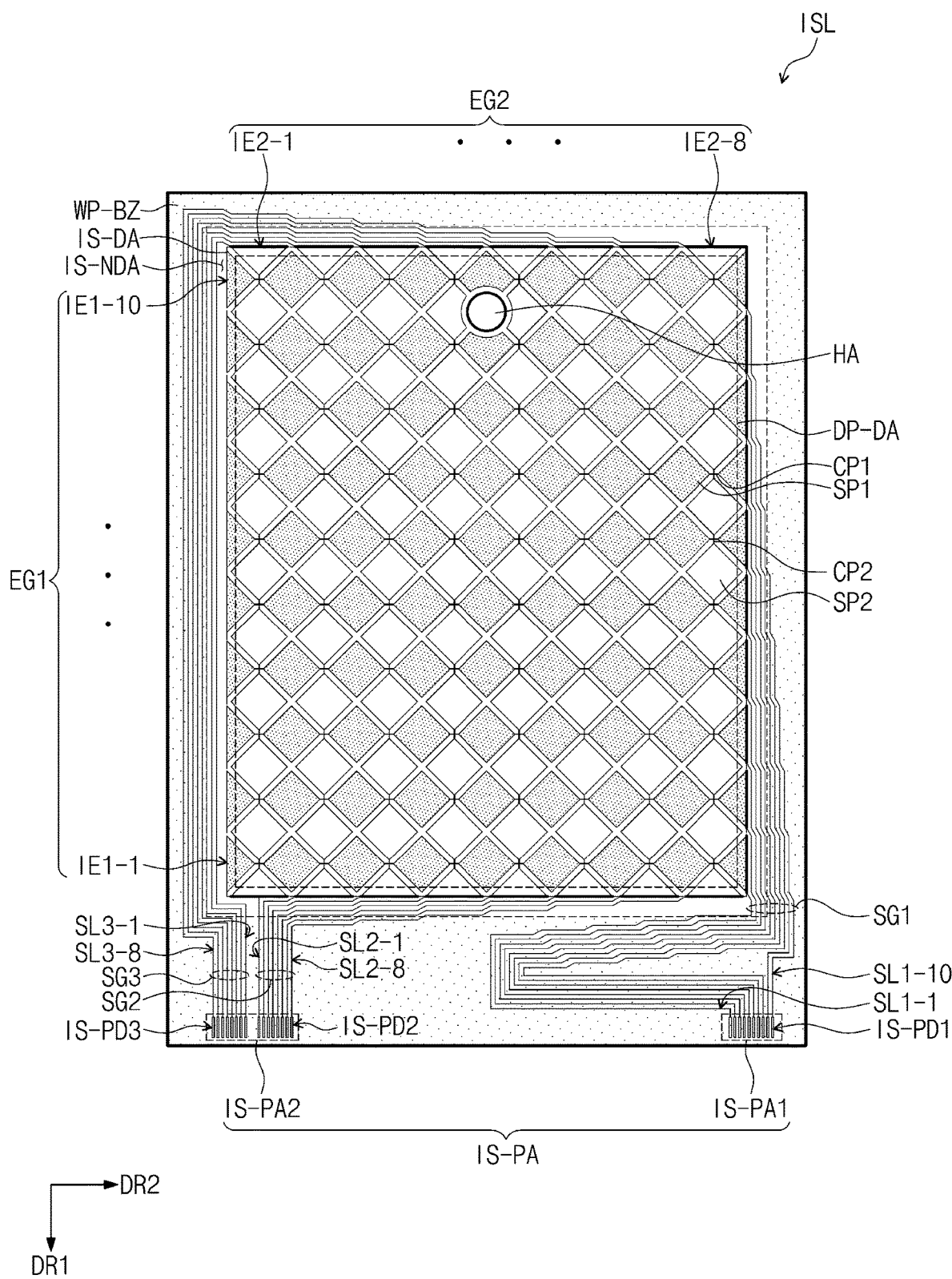
FIG. 11B is a planar view illustrating an input detection sensor according to an exemplary embodiment.

FIG. 9A is a perspective view of the display module DM according to an exemplary embodiment. FIG. 9B is a planar view illustrating the input detection sensor ISL according to an exemplary embodiment. FIG. 10A is a perspective view of the display module DM according to an exemplary embodiment. FIG. 10B is a planar view illustrating the input detection sensor ISL according to an exemplary embodiment. FIG. 11A is a perspective view of the display module DM according to an exemplary embodiment. FIG. 11B is a planar view illustrating the input detection sensor ISL according to an exemplary embodiment. Hereinafter, detailed descriptions of substantially the same elements and configurations as described above with reference to FIGS. 1 to 8C will be omitted to avoid redundancy. FIGS. 9B, 10B, and 11B are illustrated with reference to FIG. 6B. A region in which the light shielding pattern WP-BZ (see FIG. 7B) is disposed is shaded.

FIGS. 9A to 11B illustrate a "layer"-type input detection sensor ISL according to an exemplary embodiment. However, the inventive concepts are not limited thereto, and the display device may include a "panel"-type input detection sensor in some exemplary embodiments.

A notch region NTA, which is recessed inward in a planar view, is defined in the display module DM, as illustrated in FIG. 9A. The notch region NTA may be defined in each of the display panel DP and the input detection sensor ISL, but the notch regions NTA thereof may be the same or different from each other.

The position and arrangement of the first electrode group EG1, the second electrode group EG2, the first signal line group SG1, and the second signal line group SG2 illustrated in FIG. 9B is different from those of the input detection sensor ISL illustrated in FIG. 6B due to the notch region NTA.

As illustrated in FIG. 9B, the first to tenth signal lines SL1-1 to SL1-10 of the first signal line group SG1 are respectively connected to one ends of the first to tenth electrodes IE1-1 to IE1-10 of the first electrode group EG1. The first to tenth signal lines SL1-1 to SL1-10 are respectively connected to one ends, e.g., left ends in FIG. 9A, of the first to tenth electrodes IE1-1 to IE1-10, in which the notch region NTA is not formed. The one ends of the first to tenth electrodes IE1-1 to IE1-10 are aligned in a row in the first direction DR1.

Since the notch region NTA is formed, a portion of the first to tenth electrodes IE1-1 to IE1-10 have a shorter length than another portion of the first to tenth electrodes IE1-1 to IE1-10. The first to $p^{th}$ electrodes (where "p" is a natural number greater than 1 and less than i) have a shorter length than the $(p+1)^{th}$ to $i^{th}$ electrodes.

The other ends of the $(p+1)^{th}$ to $i^{th}$ electrodes, e.g., the right ends in the illustrated exemplary embodiment, are adjacent to the notch region NTA. The $(p+1)^{th}$ to $i^{th}$ electrodes may have substantially the same length, but are not limited thereto. The lengths of the $(p+1)^{th}$ to $i^{th}$ electrodes may be differently adjusted according to a shape of the notch region NTA. In FIG. 9B, "p" is assumed to be 9, for example.

As illustrated in FIG. 9B, the first to eighth signal lines SL2-1 to SL2-8 of the second signal line group SG2 are respectively connected to one ends of the first to eighth electrodes IE2-1 to IE2-8 of the second electrode group EG2. In an exemplary embodiment, the one ends correspond to lower ends adjacent to the pad regions IS-PA1 and IS-PA2.

The one ends of the first to eighth electrodes IE2-1 to IE2-8 are aligned in a row in the second direction DR2. Due to the notch region NTA, a portion of the first to eighth electrodes IE2-1 to IE2-8 have a shorter length than another portion of the first to eighth electrodes IE2-1 to IE2-8. The first to $q^{th}$ electrodes (where "q" is a natural number less than "j") have a shorter length than the $(q+1)^{th}$ to $j^{th}$ electrodes. The other ends of the first to $q^{th}$ electrodes, e.g., the upper ends in the illustrated exemplary embodiment, are adjacent to the notch region NTA.

The $(q+1)^{th}$ to $j^{th}$ electrodes may have substantially the same length, but the inventive concepts are not limited thereto. For example, the lengths of the $(q+1)^{th}$ to $j^{th}$ electrodes may be differently adjusted according to the shape of the notch region NTA. In FIG. 9B, "q" is assumed to be 2, for example.

In the illustrated exemplary embodiment, the first to tenth signal lines SL1-1 to SL1-10 of the first signal line group SG1 are laterally symmetric with respect to the first to tenth signal lines SL1-1 to SL1-10 illustrated in FIG. 6B. The first to eighth signal lines SL2-1 to SL2-8 of the second signal line group SG2 are laterally symmetric with respect to the first to eighth signal lines SL2-1 to SL2-8 illustrated in FIG. 6B.

The notch region NTA is illustrated as being disposed on an upper right side in FIG. 9B, but the notch region NTA may be disposed on another corner region in some exemplary embodiments. For example, when the notch region NTA is disposed on an upper left side, the first to tenth signal lines SL1-1 to SL1-10 of the first signal line group SG1 may be positioned and arranged in substantially the same manner as the first to tenth signal lines SL1-1 to SL1-10 illustrated in FIG. 6B.

As illustrated in FIG. 10A, the notch region NTA may be defined in a center region in the second direction DR2. However, the notch region NTA is not necessarily required to be disposed in an exact center region.

As illustrated in FIG. 10B, shapes of the first electrode group EG1 and the second electrode group EG2 may be changed due to the notch region NTA. The positions and arrangement of the first signal line group SG1 and the second signal line group SG2 may be substantially the same as the input detection sensor ISL of FIG. 6B.

As illustrated in FIG. 10B, the tenth electrode IE1-10 may be divided into two parts due to the notch region NTA. The two parts may be connected by a dummy signal line DSL. The fourth to sixth electrodes IE2-4 to IE2-6 of the second electrode group EG2 may have a shorter length than the other electrodes.

The dummy signal line DSL may be disposed on a layer, which is different from a layer of the third signal line group SG3. The dummy signal line DSL may be formed with one of the first layer SL-L1 and the second layer SL-L2, and the third signal line group SG3 may be formed with the remaining one.

As illustrated in FIG. 11A, a hall region HA may be defined in the display module DM in a planar view. The hall region HA is defined by removing parts of the display panel DP and the input detection sensor ISL. The hall region HA of the display panel DP and the hall region HA of the input detection sensor ISL are not necessarily required to be identical. The hall region HA may be a transfer passage of an optical signal. In some exemplary embodiments, the hole regions HA may formed in plural in the display module DM.

The hall region HA of the display panel DP may be a region corresponding to the plurality of light emission regions PXA-R, PXA-G, and PXA-B (see FIG. 6F). The sensor units SP1 and SP2 may be removed from the hall region HA of the input detection sensor ISL.

As illustrated in FIG. 11B, the shapes of the first electrode group EG1 and the second electrode group EG2 may be changed due to the hall region HA. The positions and arrangement of the first signal line group SG1 and the second signal line group SG2 may be substantially the same as the input detection sensor ISL of FIG. 6B.

The hall region HA of the input detection sensor ISL may be disposed in an intersection region between the first electrode group EG1 and the second electrode group EG2. Here, a dummy signal line may be disposed around the hall region HA of the input detection sensor ISL. For example, the dummy signal line may detour around the hall region HA to connect the separated electrodes of the first electrode group EG1 and the second electrode group EG2.

According to exemplary embodiments, the first signal line group connected to the first electrode group of the input detection sensor may have substantially the same resistance. Therefore, the sensing sensitivity is improved.

Even though the third parts for controlling the resistance of the first signal lines are densely arranged in a narrow region, a light leakage phenomenon may be reduced in the third parts as external light incident to the third parts may be blocked by the light shielding pattern.

Since the bent region of the third parts corresponds to the bent region of the second signal line group, reliability of visual inspection of the first signal line group and the second signal line group is improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a window;
   a display panel disposed under the window; and
   an input detection sensor disposed between the window and the display panel,
   wherein the input detection sensor comprises:
      a first electrode extending in a first direction;
      a second electrode extending in a second direction crossing the first direction;
      a first signal line electrically connected to the first electrode; and
      a second signal line electrically connected to the second electrode,
   wherein the first signal line comprises a first-first line part, a first-second line part, and a first intermediate part between the first-first line part and the first-second line part and extending in a direction crossing the first direction and the second direction or the second direction,
   the second signal line comprises a second-first line part, a second-second line part, and a second intermediate part between the second-first line part and the second-second line part and extending in a direction crossing the first direction and the second direction or the second direction,
   the first-second line part is disposed farther from the second electrode than the first-first line part in the first direction,
   the second-second line part is disposed farther from the second electrode than the second-first line part in the first direction,
   the second-first line part and the second-second line part are disposed farther from the second electrode than the first-second line part in the first direction,
   the first-first line part, the first-second line part, the second-first line part, and the second-second line part are substantially extended in a same direction,
   the first-first line part and the second-first line part cross on a first imaginary line extending in the first direction, and
   the first-second line part and the second-second line part cross on a second imaginary line extending in the first direction.

2. The display device of claim 1, wherein the first intermediate part and the second intermediate part are extended in a same direction.

3. The display device of claim 1, wherein the first signal line further comprises a first-third line part disposed farther from the second electrode than the first-second line part in the first direction and a first part bent from the first-third line part.

4. The display device of claim 3, wherein the second signal line further comprises a second-third line part disposed farther from the second electrode than the second-second line part in the first direction and a second part bent from the second-third line part.

5. The display device of claim 4, wherein the first part and the second part cross on a third imaginary line extending in the second direction.

6. The display device of claim 1, wherein the second signal line further comprises a second-third line part disposed farther from the second electrode than the second-second line part in the first direction, a second-first part bent from the second-third line part and a second-second part bent from the first-first line part.

7. The display device of claim 6, wherein the input detection sensor further comprises
 a third electrode extending in the second direction; and
 a third signal line electrically connected to the third electrode, and
 wherein the third electrode is disposed farther from the first-first line part than the second electrode in the first direction.

8. The display device of claim 7, wherein the third signal line comprises a third-first line part, a third-second line part, and a third intermediate part between the third-first line part and the third-second line part and extending in a direction crossing the first direction and the second direction or the second direction, and
 the third-first line part is disposed farther from the second electrode than the second-first line part in the first direction.

9. The display device of claim 8, wherein the third signal line further comprises a third-third line part disposed farther from the second electrode than the third-second line part in the first direction, a third-first part bent from the second-third line part and a third-second part bent from the first-first line part.

10. The display device of claim 9, wherein the third-third line part, the third-first part, and the third-second part are disposed between the second-third line part and the second-second part in the first direction.

11. The display device of claim 1, wherein line widths of the second-first line part and the second-second line part are substantially uniform.

12. The display device of claim 1, wherein the second-first line part and the second-second line part have a substantially same line width.

* * * * *